US011277118B2

(12) United States Patent
Hong et al.

(10) Patent No.: US 11,277,118 B2
(45) Date of Patent: Mar. 15, 2022

(54) VARIABLE GAIN PHASE SHIFTER

(71) Applicant: Korea Advanced Institute of Science and Technology, Daejeon (KR)

(72) Inventors: Song-cheol Hong, Daejeon (KR); Jin-seok Park, Daejeon (KR); Seung-hun Wang, Daejeon (KR); Seung-hoon Kang, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 17/071,318

(22) Filed: Oct. 15, 2020

(65) Prior Publication Data

US 2021/0028768 A1 Jan. 28, 2021

Related U.S. Application Data

(62) Division of application No. 16/640,458, filed as application No. PCT/KR2017/014913 on Dec. 18, 2017, now Pat. No. 10,848,130.

(30) Foreign Application Priority Data

Sep. 5, 2017 (KR) .......................... 10-2017-0113484
Sep. 5, 2017 (KR) .......................... 10-2017-0113485

(51) Int. Cl.
*H03H 11/20* (2006.01)
*H03H 11/04* (2006.01)
*H03M 1/66* (2006.01)

(52) U.S. Cl.
CPC ............. *H03H 11/20* (2013.01); *H03H 11/04* (2013.01); *H03M 1/66* (2013.01)

(58) Field of Classification Search
CPC ......... H03H 11/20; H03H 11/04; H03M 1/66; H03M 1/747; H01P 1/18; H01Q 3/36
See application file for complete search history.

(56) References Cited

U.S. PATENT DOCUMENTS

2010/0128820 A1 5/2010 Ko
2017/0019067 A1* 1/2017 Chakraborty ........ H03D 7/1458
2020/0220524 A1 7/2020 Hong et al.

FOREIGN PATENT DOCUMENTS

KR 20-0307077 2/2003
KR 10-0532157 B1 11/2005
(Continued)

OTHER PUBLICATIONS

International Search Report (with English Translation) dated Jun. 4, 2018 for International Application No. PCT/KR2017/014913; 4 Pages.

(Continued)

*Primary Examiner* — Sibin Chen
(74) *Attorney, Agent, or Firm* — Daly Crowley Mofford & Durkee, LLP

(57) ABSTRACT

A variable gain phase shifter includes an I/Q generator and a vector summation circuit. The I/Q generator generates phase signals based on an input signal. The vector summation circuit adjusts magnitudes and directions of first, second, third and fourth in-phase vectors and first, second, third and fourth quadrature vectors, and generates an output signal by summing the in-phase vectors and the quadrature vectors, based on the phase signals, selection signals and current control signals. The vector summation circuit includes first, second, third and fourth vector summation cells and first, second, third and fourth current control circuits. The first and second vector summation cells adjust the directions of the first and second in-phase vectors and the first and second quadrature vectors. The third and fourth vector summation cells adjust the directions of the third and fourth in-phase vectors and the third and fourth quadrature vectors. The first and second current control circuits are connected to the first and second vector summation cells, and adjust an amount of a first current and an amount of a (Continued)

second current. The third and fourth current control circuits are connected to the third and fourth vector summation cells, and adjust an amount of a third current and an amount of a fourth current.

13 Claims, 21 Drawing Sheets

(56) References Cited

FOREIGN PATENT DOCUMENTS

| KR | 10-2005-0113771 A | 12/2005 |
| KR | 10-2005-0113773 A | 12/2005 |
| KR | 10-1195778 B1 | 11/2012 |
| WO | WO 2010/120779 A2 | 10/2010 |

OTHER PUBLICATIONS

U.S. Restriction Requirement dated Apr. 22, 2020 for U.S. Appl. No. 16/640,458; 6 Pages.
Response to U.S. Restriction Requirement dated Apr. 22, 2020 for U.S. Appl. No. 16/640,458; Response filed Jun. 18, 2020; 2 Pages.
U.S. Ex Parte Quayle Action dated Jul. 16, 2020 for U.S. Appl. No. 16/640,458; 7 Pages.
Response to U.S. Ex Parte Quayle Action dated Jul. 16, 2020 for U.S. Appl. No. 16/640,458; Response filed Sep. 10, 2020; 9 Pages.
U.S. Notice of Allowance dated Sep. 29, 2020 for U.S. Appl. No. 16/640,458; 5 Pages.

\* cited by examiner

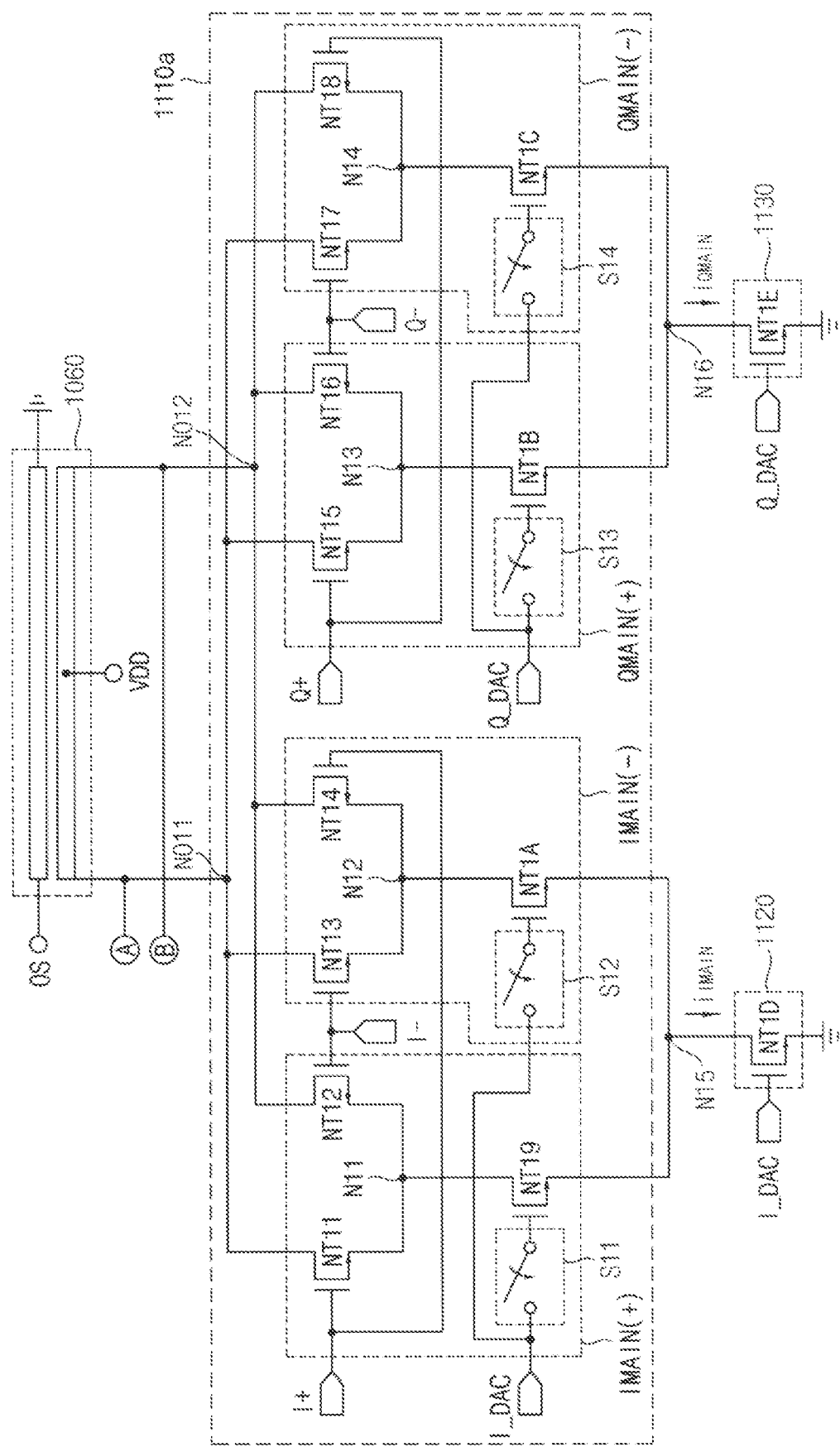

FIG. 8

|  | VIM1, VQM1 | VIM2, VQM2 | VIA1, VQA1 | VIA2, VQA2 |
|---|---|---|---|---|
| GAIN_MAX | + | + | + | + |
| GAIN_M1 | + | + | − | − |
| GAIN_M2 | + | − | + | − |
| GAIN_MIN | + | − | − | + |

VARIABLE GAIN PHASE SHIFTER

CROSS-REFERENCE TO RELATED APPLICATION

This application is a divisional application of U.S. patent application Ser. No. 16/640,458 filed on Feb. 20, 2020, which is a U.S. National Stage Application of International Application No. PCT/KR2017/014913 filed on Dec. 18, 2017 which is based upon and claims the benefit of priority to Korean Patent Applications Nos. 10-2017-0113484 and 10-2017-0113485, filed on Sep. 5, 2017 in the Korean Intellectual Property Office. The disclosures of the above-listed applications are hereby incorporated by reference herein in their entirety.

BACKGROUND

1. Technical Field

Example embodiments relate generally to signal processing techniques, and more particularly to variable gain phase shifters that are applied to beam-forming systems.

2. Description of the Related Art

A fifth generation (5G) mobile communication system, which is currently being studied, requires a network capacity of about several tens to several hundreds times as compared with a long term evolution (LTE), which is a fourth generation (4G) mobile communication system. Techniques such as massive multi-input multi-output (MIMO) and beam-forming may be used for a 5G mobile communication system.

In a wireless communication, a beam-forming is a technique of a smart antenna, and is a technique for illuminating a beam of an antenna only to a corresponding terminal. Recently, an analog phase array beam-forming to form a phase array in a radio frequency (RF) stage has been studied, and particularly a phase shift block and a gain adjustment block, which are key or core blocks, have been studied. The phase shift block changes a phase to suit each signal path, and the gain adjustment block compensates a gain error for each signal path.

Conventionally, the phase shift block and the gain adjustment block are designed separately, however, there is a problem that it is difficult to independently control the phase and the gain. In addition, conventionally, a variable gain amplifier (VGA) or an attenuator is used as the gain adjustment block, however, there is a problem that a size of circuit increases.

SUMMARY

Some example embodiments provide a variable gain phase shifter capable of independently controlling or adjusting a phase and a gain at once.

According to example embodiments, a variable gain phase shifter includes an in-phase/quadrature (I/Q) generator and a vector summation circuit. The I/Q generator generates first, second, third and fourth phase signals based on an input signal. The vector summation circuit adjusts magnitudes and directions of first, second, third and fourth in-phase vectors and first, second, third and fourth quadrature vectors, and generates first and second differential output signals corresponding to an output signal by summing the first, second, third and fourth in-phase vectors and the first, second, third and fourth quadrature vectors, based on the first, second, third and fourth phase signals, first, second, third and fourth selection signals and first, second, third and fourth current control signals. The vector summation circuit includes first, second, third and fourth vector summation cells and first, second, third and fourth current control circuits. The first and second vector summation cells adjust the directions of the first and second in-phase vectors and the first and second quadrature vectors based on the first and second selection signals. The third and fourth vector summation cells adjust the directions of the third and fourth in-phase vectors and the third and fourth quadrature vectors based on the third and fourth selection signals. The first and second current control circuits are connected to the first and second vector summation cells, and adjust an amount of a first current corresponding to the first and second in-phase vectors and an amount of a second current corresponding to the first and second quadrature vectors based on the first and second current control signals. The third and fourth current control circuits are connected to the third and fourth vector summation cells, and adjust an amount of a third current corresponding to the third and fourth in-phase vectors and an amount of a fourth current corresponding to the third and fourth quadrature vectors based on the third and fourth current control signals.

In some example embodiments, a magnitude ratio between the first in-phase vector and the second in-phase vector and a magnitude ratio between the first quadrature vector and the second quadrature vector may be determined based on a size ratio between the first vector summation cell and the second vector summation cell. A magnitude ratio between the third in-phase vector and the fourth in-phase vector and a magnitude ratio between the third quadrature vector and the fourth quadrature vector may be determined based on a size ratio between the third vector summation cell and the fourth vector summation cell.

In some example embodiments, the first vector summation cell may include a first vector circuit, a second vector circuit, a third vector circuit and a fourth vector circuit. The first vector circuit may be connected between first and second output nodes and a first node, and may be selectively enabled based on the first selection signal and to receive the first and second phase signals. The first and second output nodes may output the first and second differential output signals, respectively. The second vector circuit may be connected between the first and second output nodes and the first node, and may be selectively enabled based on the first selection signal and to receive the first and second phase signals. The third vector circuit may be connected between the first and second output nodes and a second node, and may be selectively enabled based on the first selection signal and to receive the third and fourth phase signals. The fourth vector circuit may be connected between the first and second output nodes and the second node, and may be selectively enabled based on the first selection signal and to receive the third and fourth phase signals.

In some example embodiments, the first current control circuit may include a first current control transistor that is connected between the first node and a ground voltage and has a gate electrode receiving the first current control signal. The second current control circuit may include a second current control transistor that is connected between the second node and the ground voltage and has a gate electrode receiving the second current control signal.

In some example embodiments, the first vector circuit may include a first transistor, a second transistor, a third transistor and a first switch. The first transistor may be connected between the first output node and a third node and may have a gate electrode receiving the first phase signal. The second transistor may be connected between the second output node and the third node and may have a gate electrode receiving the second phase signal. The third transistor may be connected between the third node and the first node. The first switch may selectively provide the first current control signal to a gate electrode of the third transistor based on the first selection signal.

In some example embodiments, the variable gain phase shifter may further include a digital-to-analog converter that generates the first, second, third and fourth current control signals. The digital-to-analog converter may include a first complementary converter, a second complementary converter and a third complementary converter. The first complementary converter may generate first and second intermediate control signals based on first digital control bits. The second complementary converter may generate the first and second current control signals based on second digital control bits and the first intermediate control signal. The third complementary converter may generate the third and fourth current control signals based on the second digital control bits and the second intermediate control signal.

In some example embodiments, the first complementary converter may include a plurality of first transistors, a plurality of first switches, a first current mirror transistor and a second current mirror transistor. Gate electrodes of the plurality of first transistors may be commonly connected to each other. The plurality of first switches may electrically connect the plurality of first transistors with one of a first node and a second node based on the first digital control bits. The first current mirror transistor may be connected between the first node and a ground voltage and may have a gate electrode connected to the first node to provide the first intermediate control signal. The second current mirror transistor may be connected between the second node and the ground voltage and may have a gate electrode connected to the second node to provide the second intermediate control signal.

In some example embodiments, the second complementary converter may include a plurality of second transistors, a plurality of second switches, a third current mirror transistor and a fourth current mirror transistor. Gate electrodes of the plurality of second transistors may be commonly connected to each other. The plurality of second switches may electrically connect the plurality of second transistors with one of a third node and a fourth node based on the second digital control bits. The third current mirror transistor may be connected between the third node and the ground voltage and may have a gate electrode connected to the third node to provide the first current control signal. The fourth current mirror transistor may be connected between the fourth node and the ground voltage and may have a gate electrode connected to the fourth node to provide the second current control signal.

In some example embodiments, the third complementary converter may include a plurality of third transistors, a plurality of third switches, a fifth current mirror transistor and a sixth current mirror transistor. Gate electrodes of the plurality of third transistors may be commonly connected to each other. The plurality of third switches may electrically connect the plurality of third transistors with one of a fifth node and a sixth node based on the second digital control bits. The fifth current mirror transistor may be connected between the fifth node and the ground voltage and may have a gate electrode connected to the fifth node to provide the third current control signal. The sixth current mirror transistor may be connected between the sixth node and the ground voltage and may have a gate electrode connected to the sixth node to provide the fourth current control signal.

According to example embodiments, a variable gain phase shifter includes an in-phase/quadrature (I/Q) generator, a vector summation circuit and a digital-to-analog converter. The I/Q generator generates first, second, third and fourth phase signals based on an input signal. The vector summation circuit adjusts magnitudes and directions of first and second in-phase vectors and first and second quadrature vectors, and generates first and second differential output signals corresponding to an output signal by summing the first and second in-phase vectors and the first and second quadrature vectors, based on the first, second, third and fourth phase signals, first and second selection signals and first, second, third and fourth current control signals. The digital-to-analog converter generates the first, second, third and fourth current control signals. The vector summation circuit includes first and second vector summation cells and first, second, third and fourth current control circuits. The first vector summation cell adjusts the directions of the first in-phase vector and the first quadrature vector based on the first selection signal. The second vector summation cell adjusts the directions of the second in-phase vector and the second quadrature vector based on the second selection signal. The first and second current control circuits are connected to the first vector summation cell, and adjust an amount of a first current corresponding to the first in-phase vector and an amount of a second current corresponding to the first quadrature vector based on the first and second current control signals. The third and fourth current control circuits are connected to the second vector summation cell, and adjust an amount of a third current corresponding to the second in-phase vector and an amount of a fourth current corresponding to the second quadrature vector based on the third and fourth current control signals. The digital-to-analog converter includes a first complementary converter, a second complementary converter and a third complementary converter. The first complementary converter generates first and second intermediate control signals based on first digital control bits. The second complementary converter generates the first and second current control signals based on second digital control bits and the first intermediate control signal. The third complementary converter generates the third and fourth current control signals based on the second digital control bits and the second intermediate control signal.

According to example embodiments, a variable gain phase shifter includes an in-phase/quadrature (I/Q) generator and a vector summation circuit. The I/Q generator generates first, second, third and fourth phase signals based on an input signal. The vector summation circuit adjusts magnitudes of first, second, third and fourth vectors, and generates first and second differential output signals corresponding to an output signal by summing the first, second, third and fourth vectors, based on the first, second, third and fourth phase signals and first, second, third and fourth current control signals. The first and second vectors have in-phase components and opposite directions, and the third and fourth vectors have quadrature components and opposite directions. The vector summation circuit includes first, second, third and fourth current control circuits and a vector summation cell. The first current control circuit adjusts an amount of a first current corresponding to the first vector based on one of the first and second current control signals. The second current control circuit adjusts an amount of a second current corresponding to the second vector based on another one of the first and second current control signals.

The third current control circuit adjusts an amount of a third current corresponding to the third vector based on one of the third and fourth current control signals. The fourth current control circuit adjusts an amount of a fourth current corresponding to the fourth vector based on another one of the third and fourth current control signals. The vector summation cell is connected to all the first, second, third and fourth current control circuits, receives the first, second, third and fourth phase signals, and generates the first and second differential output signals based on the first, second, third and fourth currents.

In some example embodiments, the vector summation cell may include a first vector circuit, a second vector circuit, a third vector circuit and a fourth vector circuit. The first vector circuit may be connected between first and second output nodes and a first node, and may receive the first and second phase signals. The first and second output nodes may output the first and second differential output signals, respectively. The second vector circuit may be connected between the first and second output nodes and a second node, and may receive the first and second phase signals. The third vector circuit may be connected between the first and second output nodes and a third node, and may receive the third and fourth phase signals. The fourth vector circuit may be connected between the first and second output nodes and a fourth node, and may receive the third and fourth phase signals.

In some example embodiments, the first current control circuit may include a first current control transistor that is connected between the first node and a ground voltage and has a gate electrode receiving the one of the first and second current control signals. The second current control circuit may include a second current control transistor that is connected between the second node and the ground voltage and has a gate electrode receiving the other one of the first and second current control signals. The third current control circuit may include a third current control transistor that is connected between the third node and the ground voltage and has a gate electrode receiving the one of the third and fourth current control signals. The fourth current control circuit may include a fourth current control transistor that is connected between the fourth node and the ground voltage and has a gate electrode receiving the other one of the third and fourth current control signals.

In some example embodiments, the first vector circuit may include a first transistor and a second transistor. The first transistor may be connected between the first output node and the first node, and may have a gate electrode receiving the first phase signal. The second transistor may be connected between the second output node and the first node, and may have a gate electrode receiving the second phase signal.

In some example embodiments, the variable gain phase shifter may further include a digital-to-analog converter that generates the first, second, third and fourth current control signals. The digital-to-analog converter may include a first complementary converter, a second complementary converter and a third complementary converter. The first complementary converter may generate first and second intermediate control signals based on first digital control bits. The second complementary converter may generate the first and second current control signals based on second digital control bits and the first intermediate control signal. The third complementary converter may generate the third and fourth current control signals based on the second digital control bits and the second intermediate control signal.

In some example embodiments, the variable gain phase shifter may further include a first double pole double throw (DPDT) switch. The first DPDT switch may be connected to an output terminal of the second complementary converter, may provide the one of the first and second current control signals to the first current control circuit, and may provide the other one of the first and second current control signals to the second current control circuit.

In some example embodiments, the variable gain phase shifter may further include a second DPDT switch. The second DPDT switch may be connected to an output terminal of the third complementary converter, may provide the one of the third and fourth current control signals to the third current control circuit, and may provide the other one of the third and fourth current control signals to the fourth current control circuit.

In some example embodiments, the I/Q generator may include a resistor-capacitor (RC) ladder and a poly phase filter. The RC ladder may generate first, second, third and fourth intermediate phase signals based on first and second differential input signals corresponding to the input signal. The poly phase filter may generate the first, second, third and fourth phase signals based on the first, second, third and fourth intermediate phase signals.

In some example embodiments, the RC ladder may include first, second, third and fourth capacitors and first, second, third and fourth resistors. The first capacitor may be connected between a first input node receiving the first differential input signal and a first intermediate node outputting the first intermediate phase signal. The second capacitor may be connected between a second input node receiving the second differential input signal and a second intermediate node outputting the second intermediate phase signal. The first resistor may be connected between the first input node and a third intermediate node outputting the third intermediate phase signal. The second resistor may be connected between the second input node and a fourth intermediate node outputting the fourth intermediate phase signal. The third and fourth resistors may be connected in series between the first intermediate node and the second intermediate node. The third and fourth capacitors may be connected in series between the third intermediate node and the fourth intermediate node.

In some example embodiments, the poly phase filter may include fifth, sixth, seventh and eighth capacitors and fifth, sixth, seventh and eighth resistors. The fifth capacitor may be connected between the first intermediate node and a first output node outputting the first phase signal. The sixth capacitor may be connected between the second intermediate node and a second output node outputting the second phase signal. The seventh capacitor may be connected between the third intermediate node and a third output node outputting the third phase signal. The eighth capacitor may be connected between the fourth intermediate node and a fourth output node outputting the fourth phase signal. The fifth resistor may be connected between the first output node and the third intermediate node. The sixth resistor may be connected between the second output node and the fourth intermediate node. The seventh resistor may be connected between the third output node and the second intermediate node. The eighth resistor may be connected between the fourth output node and the first intermediate node.

Accordingly, in the variable gain phase shifter according to example embodiments, all of a plurality of in-phase vectors and all of a plurality of quadrature vectors may be used for the phase adjustment and the gain adjustment. For example, the magnitudes and directions of such vectors may be adjusted based on the selection signals and the current control signals, and the output signal may be generated by summing such vectors of which the magnitudes and directions are adjusted, thereby independently controlling the phase and the gain of the output signal at once using one block.

For example, the vector summation circuit included in the variable gain phase shifter may be implemented based on the current separation scheme such that the vector summation circuit includes two vector summation cells and four current control circuits connected thereto and such that one vector summation cell is controlled by two current control circuits. Accordingly, the size and manufacturing cost of the variable gain phase shifter may be reduced, and the variable gain phase shifter may be efficiently implemented with relatively high resolution by increasing the number of the control bits of the digital-to-analog converter. For another example, the vector summation circuit may be implemented based on the current separation scheme and the cell separation scheme such that the vector summation circuit includes four vector summation cells and four current control circuits connected thereto and such that two vector summation cells are controlled by two current control circuits. Accordingly, the size and manufacturing cost of the variable gain phase shifter may be reduced, and the variable gain phase shifter may have relatively high dynamic range and high resolution.

In addition, in the variable gain phase shifter according to example embodiments, both the first and second vectors having in-phase components and opposite directions and both the first and second vectors having quadrature components and opposite directions may be used for the phase adjustment and the gain adjustment. For example, the magnitudes of such vectors may be adjusted based on the current control signals, and the output signal may be generated by summing such vectors of which the magnitudes are adjusted, thereby independently controlling the phase and the gain of the output signal at once using one block.

For example, the vector summation circuit included in the variable gain phase shifter may be implemented such that the vector summation circuit includes one vector summation cell and four current control circuits connected thereto and such that a selection circuit for selecting vectors is omitted. Accordingly, the size and manufacturing cost of the variable gain phase shifter may be reduced. For another example, the digital-to-analog converter included in the variable gain phase shifter may be implemented using the complementary converters and/or the at least one DPDT switch. Accordingly, the size of the variable gain phase shifter may be reduced, and the variable gain phase shifter may be efficiently applied to a system using a relatively low operating voltage. For still another example, the I/Q generator included in the variable gain phase shifter may be implemented using both the RC ladder and the poly phase filter. Accordingly, a relatively wideband operation may be supported, and both the phase error and the amplitude error may be significantly reduced.

BRIEF DESCRIPTION OF THE DRAWINGS

FIGS. 2A and 2B are circuit diagrams illustrating a vector summation circuit included in a variable gain phase shifter according to example embodiments.

FIG. 8 is a diagram for describing an operation of a vector summation circuit included in a variable gain phase shifter according to example embodiments.

DETAILED DESCRIPTION OF THE EMBODIMENTS

Figure 1:
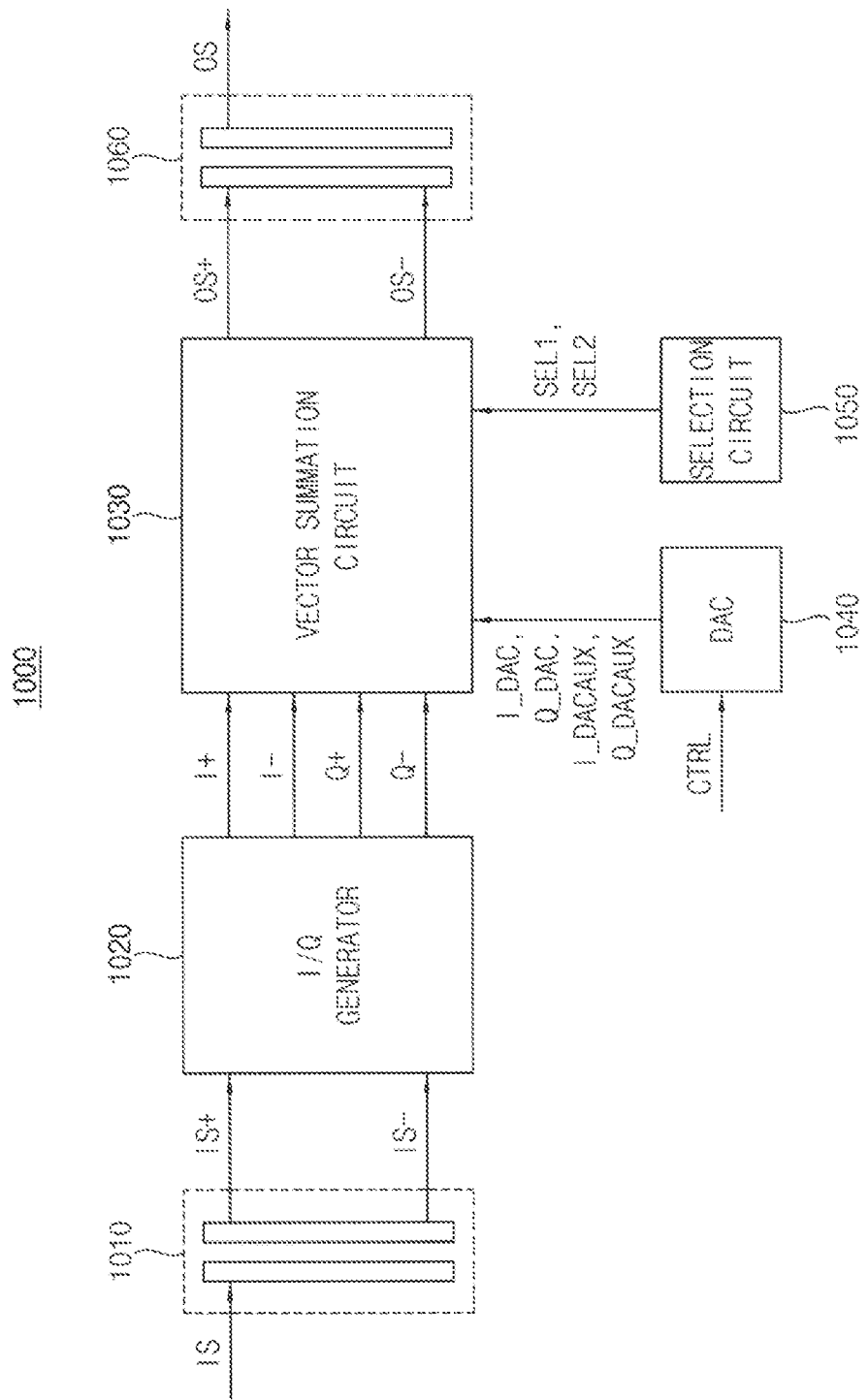
FIG. 1 is a block diagram illustrating a variable gain phase shifter according to example embodiments.

Various example embodiments will be described more fully with reference to the accompanying drawings, in which embodiments are shown. This inventive concept may, however, be embodied in many different forms and should not be construed as limited to the embodiments set forth herein.

Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The above and other features of the inventive concept will become more apparent by describing in detail example embodiments thereof with reference to the accompanying drawings. The same reference numerals are used for the same elements in the drawings and redundant explanations for the same elements are omitted.

FIG. 1 is a block diagram illustrating a variable gain phase shifter according to example embodiments.

Referring to FIG. 1, a variable gain phase shifter 1000 includes an in-phase/quadrature (I/Q) generator 1020 and a vector summation circuit 1030. The variable gain phase shifter 1000 may further include a first transmission line transformer (TLT) 1010, a digital-to-analog converter (DAC) 1040, a selection circuit 1050 and a second transmission line transformer 1060.

The first transmission line transformer 1010 may generate first and second differential input signals IS+ and IS− based on an input signal IS. For example, the first differential input signal IS+ may have a phase substantially the same as that of the input signal IS (e.g., a phase difference between the input signal IS and the first differential input signal IS+ may be about 0 degree), and a phase difference between the input signal IS and the second differential input signal IS− may be about 180 degrees. The first transmission line transformer 1010 may perform functions of a balanced-to-unbalanced (BALUN) and an impedance matching network.

The I/Q generator 1020 generates first, second, third and fourth phase signals I+, I−, Q+ and Q− based on the input signal IS, e.g., based on the first and second differential input signals IS+ and IS− corresponding to the input signal IS. For example, the first phase signal I+ may have a phase substantially the same as that of the input signal IS (e.g., a phase difference between the input signal IS and the first phase signal I+ may be about 0 degree), a phase difference between the input signal IS and the second phase signal I− may be about 180 degrees, a phase difference between the input signal IS and the third phase signal Q+ may be about 90 degrees, and a phase difference between the input signal IS and the fourth phase signal Q− may be about 270 degrees.

Each of the first and second phase signals I+ and I− having the phase difference of about 0 degree and about 180 degrees with respect to the input signal IS may be referred to as a signal having an in-phase component or simply an in-phase signal. Each of the third and fourth phase signals Q+ and Q− having the phase difference of about 90 degree and about 270 degrees with respect to the input signal IS may be referred to as a signal having a quadrature component or simply a quadrature signal.

The vector summation circuit 1030 adjusts magnitudes and directions of first and second in-phase vectors and first and second quadrature vectors, and generates first and second differential output signals OS+ and OS− corresponding to an output signal OS by summing the first and second in-phase vectors and the first and second quadrature vectors, based on the first, second, third and fourth phase signals I+, I−, Q+ and Q−, first and second selection signals SEL1 and SEL2 and first, second, third and fourth current control signals I_DAC, Q_DAC, I_DACAUX and Q_DACAUX. A detailed configuration of the vector summation circuit 1030 will be described later with reference to FIGS. 2A and 2B.

As will be described later with reference to FIGS. 3A and 3B, the first and second in-phase vectors may be vectors having in-phase components, and may have the same direction or opposite directions. The first and second quadrature vectors may be vectors having quadrature components, and may have the same direction or opposite directions. The vector summation circuit 1030 may determine the directions of the first and second in-phase vectors and the first and second quadrature vectors based on the first and second selection signals SEL1 and SEL2, and may adjust the amount of first, second, third and fourth currents corresponding to the first and second in-phase vectors and the first and second quadrature vectors based on the first, second, third and fourth current control signals I_DAC, Q_DAC, I_DACAUX and Q_DACAUX. Thus, the vector summation circuit 1030 may independently control a phase and a gain of the output signal OS at once.

The digital-to-analog converter 1040 may generate the first, second, third and fourth current control signals I_DAC, Q_DAC, I_DACAUX and Q_DACAUX based on digital control bits CTRL. A detailed configuration of the digital-to-analog converter 1040 will be described later with reference to FIGS. 4 and 5.

The selection circuit 1050 may generate the first and second selection signals SEL1 and SEL2. The digital-to-analog converter 1040 and the selection circuit 1050 may be referred to as one control circuit that controls the vector summation circuit 1030.

The second transmission line transformer 1060 may generate the output signal OS based on the first and second differential output signals OS+ and OS−. For example, a phase difference between the first and second differential output signals OS+ and OS− may be about 180 degrees. As with the first transmission line transformer 1010, the second transmission line transformer 1060 may perform the functions of the balanced-to-unbalanced and the impedance matching network.

The variable gain phase shifter according to example embodiments may be referred to as a vector modulator.

Figure 2B:
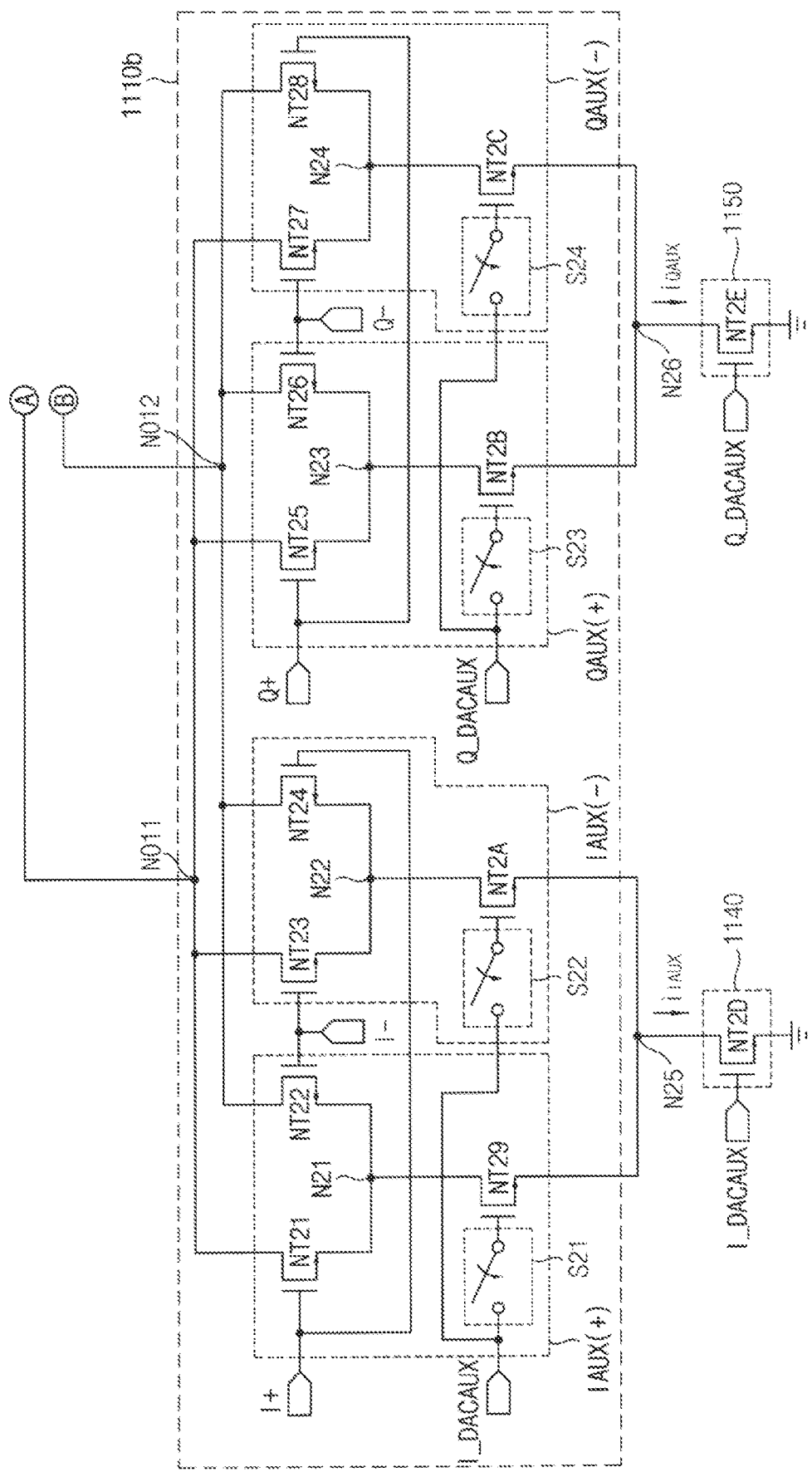

FIGS. 2A and 2B are circuit diagrams illustrating a vector summation circuit included in a variable gain phase shifter according to example embodiments.

Referring to FIGS. 1, 2A and 2B, the vector summation circuit 1030 includes a first vector summation cell 1110a, a second vector summation cell 1110b, a first current control circuit 1120, a second current control circuit 1130, a third current control circuit 1140 and a fourth current control circuit 1150.

The first vector summation cell 1110a is connected to the first and second current control circuits 1120 and 1130, receives the first, second, third and fourth phase signals I+, I−, Q+ and Q−, the first and second current control signals I_DAC and Q_DAC and the first selection signal SEL1, and adjusts the directions of the first in-phase vector and the first quadrature vector based on the first selection signal SEL1.

The first current control circuit 1120 is connected to the first vector summation cell 1110a, and adjusts the amount of a first current $i_{IMAIN}$ corresponding to the first in-phase vector based on the first current control signal I_DAC. The second current control circuit 1130 is connected to the first vector summation cell 1110a, and adjusts the amount of a second current $i_{QMAIN}$ corresponding to the first quadrature vector based on the second current control signal Q_DAC.

The first vector summation cell 1110a may include a first vector circuit IMAIN(+), a second vector circuit IMAIN(−), a third vector circuit QMAIN(+) and a fourth vector circuit QMAIN(−). The first vector circuit IMAIN(+) may be connected between first and second output nodes NO11 and NO12 and a node N15, and may receive the first and second phase signals I+ and I−. The second vector circuit IMAIN(−) may be connected in parallel with the first vector circuit IMAIN(+) between the first and second output nodes NO11 and NO12 and the node N15, and may receive the first and second phase signals I+ and I−. The third vector circuit QMAIN(+) may be connected between the first and second output nodes NO11 and NO12 and a node N16, and may receive the third and fourth phase signals Q+ and Q−. The fourth vector circuit QMAIN(−) may be connected in parallel with the third vector circuit QMAIN(+) between the first and second output nodes NO11 and NO12 and the node N16, and may receive the third and fourth phase signals Q+ and Q−. Each of the first, second, third and fourth vector circuits IMAIN(+), IMAIN(−), QMAIN(+) and QMAIN(−) may be selectively enabled or activated based on the first selection signal SEL1.

Each of the first, second, third and fourth vector circuits IMAIN(+), IMAIN(−), QMAIN(+) and QMAIN(−) may include three transistors and one switch. For example, the first vector circuit IMAIN(+) may include transistors NT11, NT12 and NT19 and a switch S11. The transistor NT11 may be connected between the first output node NO11 and a node N11, and may have a gate electrode receiving the first phase signal I+. The transistor NT12 may be connected between the second output node NO12 and the node N11, and may have a gate electrode receiving the second phase signal I−. The transistor NT19 may be connected between the node N11 and the node N15. The switch S11 may selectively provide the first current control signal I_DAC to a gate electrode of the transistor NT19 based on the first selection signal SEL1. The second vector circuit IMAIN(−) may include transistors NT13, NT14 and NT and a switch S12. The transistor NT13 may be connected between the first output node NO11 and a node N12, and may have a gate electrode receiving the second phase signal I−. The transistor NT14 may be connected between the second output node NO12 and the node N12, and may have a gate electrode receiving the first phase signal I+. The transistor NT1A may be connected between the node N12 and the node N15. The switch S12 may selectively provide the first current control signal I_DAC to a gate electrode of the transistor NT1A based on the first selection signal SEL1.

Similarly, the third vector circuit QMAIN(+) may include transistors NT15, NT16 and NT1B and a switch S13. The transistor NT15 may be connected between the first output node NO11 and a node N13, and may have a gate electrode receiving the third phase signal Q+. The transistor NT16 may be connected between the second output node NO12 and the node N13, and may have a gate electrode receiving the fourth phase signal Q−. The transistor NT1B may be connected between the node N13 and the node N16. The switch S13 may selectively provide the second current control signal Q_DAC to a gate electrode of the transistor NT1B based on the first selection signal SEL1. The fourth vector circuit QMAIN(−) may include transistors NT17, NT18 and NT1C and a switch S14. The transistor NT17 may be connected between the first output node NO11 and a node N14, and may have a gate electrode receiving the fourth phase signal Q−. The transistor NT18 may be connected between the second output node NO12 and the node N14, and may have a gate electrode receiving the third phase signal Q+. The transistor NT1C may be connected between the node N14 and the node N16. The switch S14 may selectively provide the second current control signal Q_DAC to a gate electrode of the transistor NT1C based on the first selection signal SEL1.

Although not illustrated in detail, each of the switches S11, S12, S13 and S14 included in the first vector summation cell 1110a may receive a respective one bit of the first selection signal SEL1, and may be turned on and/or off in response to the respective one bit of the first selection signal SEL1.

Each of the first and second current control circuits 1120 and 1130 may include one transistor. For example, the first current control circuit 1120 may include a first current control transistor NT1D that is connected between the node N15 and a ground voltage (e.g., a VSS or GND voltage) and has a gate electrode receiving the first current control signal I_DAC. The second current control circuit 1130 may include a second current control transistor NT1E that is connected between the node N16 and the ground voltage and has a gate electrode receiving the second current control signal Q_DAC.

The second vector summation cell 1110b is connected to the third and fourth current control circuits 1140 and 1150, receives the first, second, third and fourth phase signals I+, I−, Q+ and Q−, the third and fourth current control signals I_DACAUX and Q_DACAUX and the second selection signal SEL2, and adjusts the directions of the second in-phase vector and the second quadrature vector based on the second selection signal SEL2.

The third current control circuit 1140 is connected to the second vector summation cell 1110b, and adjusts the amount of a third current $i_{IAUX}$ corresponding to the second in-phase vector based on the third current control signal I_DACAUX. The fourth current control circuit 1150 is connected to the second vector summation cell 1110b, and adjusts the amount of a fourth current $i_{QAUX}$ corresponding to the second quadrature vector based on the fourth current control signal Q_DACAUX.

Configurations of the second vector summation cell 1110b, the third current control circuit 1140 and the fourth current control circuit 1150 may be substantially the same as configurations of the first vector summation cell 1110a, the first current control circuit 1120 and the second current control circuit 1130, respectively.

For example, the second vector summation cell 1110b may include a fifth vector circuit IAUX(+), a sixth vector circuit IAUX(−), a seventh vector circuit QAUX(+) and an eighth vector circuit QAUX(−). The fifth and sixth vector circuits IAUX(+) and IAUX(−) may be connected in parallel between the first and second output nodes NO11 and NO12 and a node N25. Each of the fifth and sixth vector circuits IAUX(+) and IAUX(−) may receive the first and second phase signals I+ and I−. The seventh and eighth vector circuits QAUX(+) and QAUX(−) may be connected in parallel between the first and second output nodes NO11 and NO12 and a node N26. Each of the seventh and eighth vector circuits QAUX(+) and QAUX(−) may receive the third and fourth phase signals Q+ and Q−. Each of the fifth, sixth, seventh and eighth vector circuits IAUX(+), IAUX(−), QAUX(+) and QAUX(−) may be selectively enabled or activated based on the second selection signal SEL2.

The fifth vector circuit IAUX(+) may include transistors NT21, NT22 and NT29 and a switch S21, and the sixth vector circuit IAUX(−) may include transistors NT23, NT24 and NT2A and a switch S22. The transistor NT21 may be connected between the first output node NO11 and a node N21, and may have a gate electrode receiving the first phase signal I+. The transistor NT22 may be connected between the second output node NO12 and the node N21, and may have a gate electrode receiving the second phase signal I−. The transistor NT29 may be connected between the node N21 and the node N25. The switch S21 may selectively provide the third current control signal I_DACAUX to a gate electrode of the transistor NT29 based on the second selection signal SEL2. The transistor NT23 may be connected between the first output node NO11 and a node N22, and may have a gate electrode receiving the second phase signal I−. The transistor NT24 may be connected between the second output node NO12 and the node N12, and may have a gate electrode receiving the first phase signal I+. The transistor NT2A may be connected between the node N22 and the node N25. The switch S22 may selectively provide the third current control signal I_DACAUX to a gate electrode of the transistor NT2A based on the second selection signal SEL2.

Similarly, the seventh vector circuit QAUX(+) may include transistors NT25, NT26 and NT2B and a switch S23, and the eighth vector circuit QAUX(−) may include transistors NT27, NT28 and NT2C and a switch S24. The transistor NT25 may be connected between the first output node NO11 and a node N23, and may have a gate electrode receiving the third phase signal Q+. The transistor NT26 may be connected between the second output node NO12 and the node N23, and may have a gate electrode receiving the fourth phase signal Q−. The transistor NT2B may be connected between the node N23 and the node N26. The switch S23 may selectively provide the fourth current control signal Q_DACAUX to a gate electrode of the transistor NT2B based on the second selection signal SEL2. The transistor NT27 may be connected between the first output node NO11 and a node N24, and may have a gate electrode receiving the fourth phase signal Q−. The transistor NT28 may be connected between the second output node NO12 and the node N24, and may have a gate electrode receiving the third phase signal Q+. The transistor NT2C may be connected between the node N24 and the node N26. The switch S24 may selectively provide the fourth current control signal Q_DACAUX to a gate electrode of the transistor NT2C based on the second selection signal SEL2.

Although not illustrated in detail, each of the switches S21, S22, S23 and S24 included in the second vector summation cell 1110b may receive a respective one bit of the second selection signal SEL2, and may be turned on and/or off in response to the respective one bit of the second selection signal SEL2.

The third current control circuit 1140 may include a third current control transistor NT2D that is connected between the node N25 and the ground voltage and has a gate electrode receiving the third current control signal I_DACAUX. The fourth current control circuit 1150 may include a fourth current control transistor NT2E that is connected between the node N26 and the ground voltage and has a gate electrode receiving the fourth current control signal Q_DACAUX.

The first and second vector summation cells 1110a and 1110b are commonly connected to the first and second output nodes NO11 and NO12, and generate the first and second differential output signals OS+ and OS− based on the first and second in-phase vectors and the first and second quadrature vectors, e.g., based on the first, second, third and fourth currents $i_{IMAIN}$, $i_{QMAIN}$, $i_{IAUX}$ and $i_{QAUX}$. The first and second output nodes NO11 and NO12 may output the first and second differential output signals OS+ and OS−, respectively, and may be connected to the second transmission line transformer 1060. A power supply voltage VDD may be applied to the second transmission line transformer 1060.

Although FIGS. 2A and 2B illustrate an example where all the transistors NT11 to NT1E and NT21 to NT2E are n-type metal oxide semiconductor (NMOS) transistors, the types and numbers of transistors included in the vector summation circuit 1030 may be changed according to example embodiments.

In a conventional phase shifter, only one of two in-phase vectors having different directions is selected, only one of two quadrature vectors having different directions is selected, and the selected vectors are summed to generate an output signal. The conventional phase shifter is effective for the phase adjustment (or control), however, has difficulty in the gain adjustment (or control).

In the variable gain phase shifter 1000 according to example embodiments, both the first and second in-phase vectors and both the first and second quadrature vectors may be used for the phase adjustment and the gain adjustment. For example, the magnitudes and directions of such vectors may be adjusted based on the selection signals SEL1 and SEL2 and the current control signals I_DAC, Q_DAC, I_DACAUX and Q_DACAUX, and the output signal OS may be generated by summing such vectors of which the magnitudes and directions are adjusted, thereby independently controlling the phase and the gain of the output signal OS at once using one block. Particularly, the vector summation circuit 1030 may be implemented based on a current separation scheme such that two vector summation cells 1110a and 1110b are commonly connected to the output nodes NO11 and NO12 and four current control circuits 1120, 1130, 1140 and 1150 are connected to two vector summation cells 1110a and 1110b, and such that one vector summation cell (e.g., the vector summation cell 1110a) is controlled by two current control circuits (e.g., the current control circuits 1120 and 1130). Accordingly, the size and manufacturing cost of the variable gain phase shifter 1000 may be reduced, and the variable gain phase shifter 1000 may be efficiently implemented with relatively high resolution by increasing the number of the control bits CTRL of the digital-to-analog converter 1040.

Figure 3A:
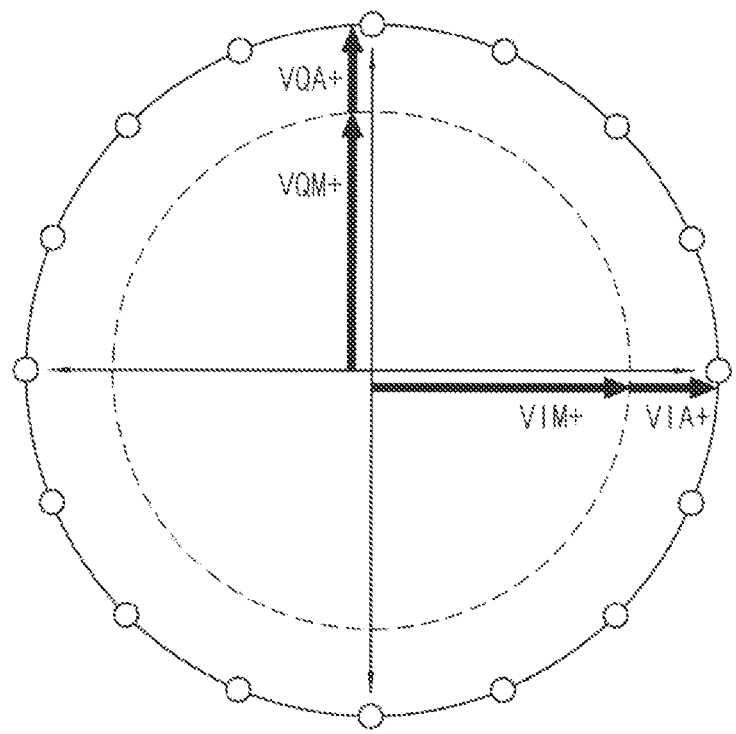
FIGS. 3A and 3B are diagrams for describing an operation of a vector summation circuit included in a variable gain phase shifter according to example embodiments.
Figure 3B:
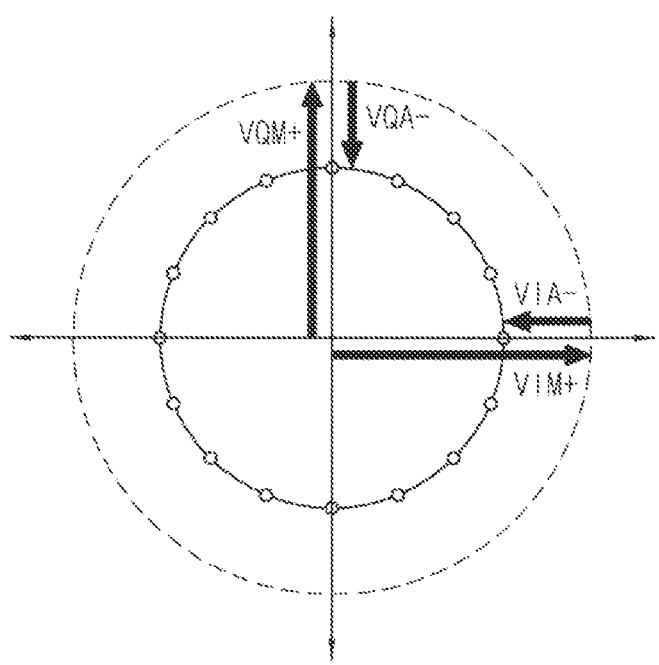

FIGS. 3A and 3B are diagrams for describing an operation of a vector summation circuit included in a variable gain phase shifter according to example embodiments.

Referring to FIGS. 2A, 2B and 3A, one of the first and second vector circuits IMAIN(+) and IMAIN(−) and the first current control circuit 1120 may provide a first path corresponding to the first in-phase vector and the first current $i_{IMAIN}$. One of the third and fourth vector circuits QMAIN(+) and QMAIN(−) and the second current control circuit 1130 may provide a second path corresponding to the first quadrature vector and the second current $i_{QMAIN}$. One of the fifth and sixth vector circuits IAUX(+) and IAUX(−) and the third current control circuit 1140 may provide a third path corresponding to the second in-phase vector and the third current $i_{IAUX}$. One of the seventh and eighth vector circuits QAUX(+) and QAUX(−) and the fourth current control circuit 1150 may provide a fourth path corresponding to the second quadrature vector and the fourth current $i_{QAUX}$.

As described above, all the four paths may be simultaneously or concurrently used in the variable gain phase shifter according to example embodiments, and the phase adjustment and the gain adjustment may be performed at once in the present invention by changing the magnitudes and directions of the vectors. In addition, the total amount of a current flowing through the vector summation circuit 1030 may be maintained constant to maintain an output impedance to the same value, and the amount of a current flowing through each path may be distributed or divided with an appropriate ratio, thereby independently controlling the phase and the gain of the output signal OS.

For example, the first, second, third and fourth currents $i_{IMAIN}$, $i_{QMAIN}$, $i_{IAUX}$ and $i_{QAUX}$ may satisfy following Equation 1, Equation 2, Equation 3 and Equation 4.

$$i_{IMAIN} = IMAIN + (IMAIN * \Delta) \quad \text{[Equation 1]}$$

$$i_{QMAIN} = IMAIN - (IMAIN * \Delta) \quad \text{[Equation 2]}$$

$$i_{IAUX} = (ITOTAL - IMAIN) + (ITOTAL - IMAIN) * \Delta \quad \text{[Equation 3]}$$

$$i_{QAUX} = (ITOTAL - IMAIN) - (ITOTAL - IMAIN) * \Delta \quad \text{[Equation 4]}$$

A current flowing through the first vector summation cell 1110a may be about (2*IMAIN), a current flowing through the second summation sum cell 1110b may be about (2*(ITOTAL−IMAIN)), and thus the total current flowing through the vector summation circuit 1030 may be always constant at about (2*ITOTAL).

The directions of the first and second in-phase vectors and the first and second quadrature vectors may be adjusted based on the first and second selection signals SEL1 and SEL2, and the magnitudes of the first and second in-phase vectors and the first and second quadrature vectors may be adjusted based on the first, second, third and fourth current control signals I_DAC, Q_DAC, I_DACAUX and Q_DACAUX, thereby controlling the phase and the gain of the output signal OS.

In other words, the phase of the output signal OS may be adjusted by changing a value Δ in Equation 1, Equation 2, Equation 3 and Equation 4 from about −1 to about 1. The gain of the output signal OS may be adjusted by changing a value IMAIN in Equation 1, Equation 2, Equation 3 and Equation 4 from about (0.5*ITOTAL) to about ITOTAL. Both the phase and gain of the output signal OS may be adjusted by simultaneously changing the value Δ and the value IMAIN in Equation 1, Equation 2, Equation 3 and Equation 4. In any cases, the total current flowing through the vector summation circuit 1030 may be maintained, and thus the output impedance may also be maintained.

In some example embodiments, to implement as illustrated in FIG. 3A, the switches S11 and S13 may be closed and the switches S12 and S14 may be opened based on the first selection signal SEL1 to select the first and third vector circuits IMAIN(+) and QMAIN(+), and thus a first in-phase vector VIM+ having a forward (or positive) direction and a first quadrature vector VQM+ having a forward direction may be selected. In addition, the switches S21 and S23 may be closed and the switches S22 and S24 may be opened based on the second selection signal SEL2 to select the fifth and seventh vector circuits IAUX(+) and QAUX(+), and thus a second in-phase vector VIA+ having a forward direction and a second quadrature vector VQA+ having a forward direction may be selected. As compared with a gain circle illustrated by a dotted line when using only the first vector summation cell 1110a, a gain circle illustrated by a solid line may be increased when both the first and second vector summation cells 1110a and 1110b are used according to example embodiments, and thus it may be seen that the gain has increased according to example embodiments. In this example, the phase may be adjusted in a first quadrant by adjusting the magnitudes (or ratio) of the first, second, third and fourth currents $i_{IMAIN}$, $i_{QMAIN}$, $i_{IAUX}$ and $i_{QAUX}$.

In other example embodiments, to implement as illustrated in FIG. 3B, the switches S11 and S13 may be closed and the switches S12 and S14 may be opened based on the first selection signal SEL1 to select the first and third vector circuits IMAIN(+) and QMAIN(+), and thus the first in-phase vector VIM+ having the forward direction and the first quadrature vector VQM+ having the forward direction may be selected. In addition, the switches S22 and S24 may be closed and the switches S21 and S23 may be opened based on the second selection signal SEL2 to select the sixth and eighth vector circuits IAUX(−) and QAUX(−), and thus a second in-phase vector VIA− having a reverse (or negative) direction and a second quadrature vector VQA− having a reverse direction may be selected. As compared with a gain circle illustrated by a dotted line when using only the first vector summation cell 1110a, a gain circle illustrated by a solid line may be decreased when both the first and second vector summation cells 1110a and 1110b are used according to example embodiments, and thus it may be seen that the gain has decreased according to example embodiments. In this example, the phase may be adjusted in the first quadrant by adjusting the magnitudes (or ratio) of the first, second, third and fourth currents $i_{IMAIN}$, $i_{QMAIN}$, $i_{IAUX}$ and $i_{QAUX}$.

Although not illustrated in FIGS. 3A and 3B, the first quadrature vector VQM+ having the forward direction and the second quadrature vector VQA+ having the forward direction may be selected, a first in-phase vector having a reverse direction and a second in-phase vector having a reverse direction may be selected, the magnitudes of the first, second, third and fourth currents $i_{IMAIN}$, $i_{QMAIN}$, $i_{IAUX}$ and $i_{QAUX}$ may be adjusted, and thus the phase may be adjusted in a second quadrant. Similarly, the first in-phase vector VIM+ having the forward direction and the second in-phase vector VIA+ having the forward direction may be selected, a first quadrature vector having a reverse direction and a second quadrature vector having a reverse direction may be selected, the magnitudes of the first, second, third and fourth currents $i_{IMAIN}$, $i_{QMAIN}$, $i_{IAUX}$ and $i_{QAUX}$ may be adjusted, and thus the phase may be adjusted in a fourth quadrant. The first and second in-phase vectors having the reverse direction may be selected, the first and second quadrature vectors having the reverse direction may be selected, the magnitudes of the first, second, third and fourth currents $i_{IMAIN}$, $i_{QMAIN}$, $i_{IAUX}$ and $i_{QAUX}$ may be adjusted, and thus the phase may be adjusted in a third quadrant.

Although FIGS. 3A and 3B illustrate examples where the directions of the first and second in-phase vectors and the first and second quadrature vectors are selected by closing only one of the switches S11 and S12, closing only one of the switches S13 and S14, closing only one of the switches S21 and S22, and closing only one of the switches S23 and S24, example embodiments are not limited thereto. For example, both the switches S11 and S12 may be simultaneously closed, both the switches S13 and S14 may be simultaneously closed, both the switches S21 and S22 may be simultaneously closed, and both the switches S23 and S24 may be simultaneously closed.

Figure 4:
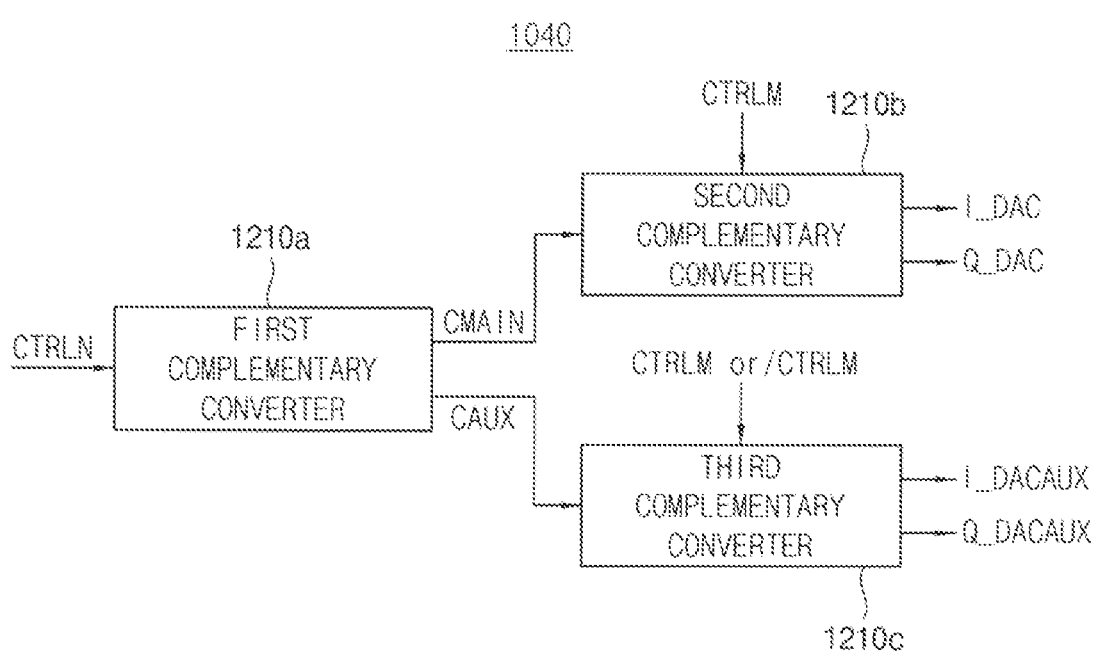
FIGS. 4 and 5 are diagrams illustrating an example of a digital-to-analog converter included in a variable gain phase shifter according to example embodiments.
Figure 5:
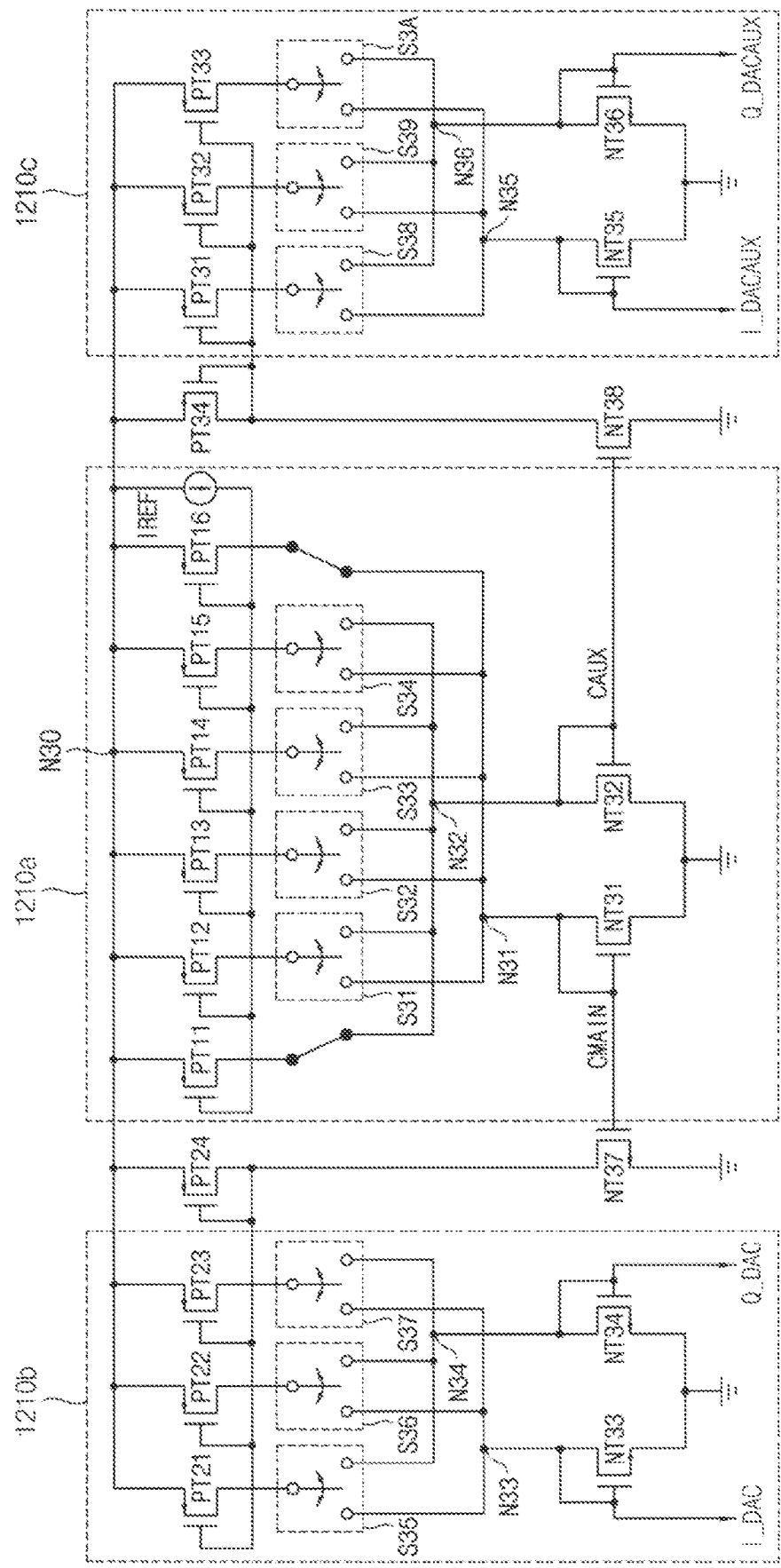

FIGS. 4 and 5 are diagrams illustrating an example of a digital-to-analog converter included in a variable gain phase shifter according to example embodiments.

Referring to FIGS. 4 and 5, the digital-to-analog converter 1040 may include a first complementary converter 1210a, a second complementary converter 1210b and a third complementary converter 1210c.

The first complementary converter 1210a may generate first and second intermediate control signals CMAIN and CAUX based on first digital control bits CTRLN. The second complementary converter 1210b may generate the first and second current control signals I_DAC and Q_DAC based on second digital control bits CTRLM and the first intermediate control signal CMAIN. The third complementary converter 1210c may generate the third and fourth current control signals I_DACAUX and Q_DACAUX based on the second digital control bits CTRLM (or inverted bits /CTRLM of the second digital control bits CTRLM) and the second intermediate control signal CAUX. As illustrated in FIG. 5, the first, second and third complementary converters 1210a, 1210b and 1210c may have a similar configuration to each other, and may operate in conjunction with each other. The overlapped portion by the first, second and third complementary converters 1210a, 1210b and 1210c may be reduced, and thus the size and power consumption may be reduced.

In some example embodiments, the first digital control bits CTRLN may have N bits where N is a natural number greater than or equal to two, and the second digital control bits CTRLM may have M bits where M is a natural number greater than or equal to two.

The first complementary converter 1210a may include a plurality of first transistors PT11, PT12, PT13, PT14, PT15 and PT16, a plurality of first switches S31, S32, S33 and S34, a first current mirror transistor NT31 and a second current mirror transistor NT32. The first complementary converter 1210a may further include a reference current source IREF.

The plurality of first transistors PT11 to PT16 may have gate electrodes commonly connected to each other, and may have first electrodes connected to a node N30. A power supply voltage may be applied to the node N30. The reference current source IREF may be connected between the node N30 and the gate electrodes of the plurality of first transistors PT11 to PT16.

The plurality of first switches S31 to S34 may electrically connect the plurality of first transistors PT11 to PT16 with one of a first node N31 and a second node N32 based on the first digital control bits CTRLN. For example, the first switch S31 may electrically connect the first transistor PT12 with one of the first node N31 and the second node N32 based on one of the first digital control bits CTRLN.

Although not illustrated in detail, each of the plurality of first switches S31 to S34 may receive a respective one bit of the first digital control bits CTRLN, and may be turned on and/or off in response to the respective one bit of the first digital control bits CTRLN.

Although FIG. 5 illustrates an example where the transistor PT11 is always connected to the second node N32, the transistor PT16 is always connected to the first node N31, and the number of the plurality of first switches S31 to S34 is smaller than the number of the plurality of first transistors PT11 to PT16, example embodiments are not limited thereto. For example, as with the second complementary converter 1210b, the number of the plurality of first switches may be equal to the number of the plurality of first transistors.

The first current mirror transistor NT31 may be connected between the first node N31 and a ground voltage, and may have a gate electrode connected to the first node N31 to provide the first intermediate control signal CMAIN. The second current mirror transistor NT32 may be connected between the second node N32 and the ground voltage, and may have a gate electrode connected to the second node N32 to provide the second intermediate control signal CAUX.

The first complementary converter 1210a may generate the first and second intermediate control signals CMAIN and CAUX by adjusting the amount of currents flowing through the first and second current mirror transistors NT31 and NT32 based on controls of the first switches S31 to S34 by the first digital control bits CTRLN. The sum of the current flowing through the first current mirror transistor NT31 and the current flowing through the second current mirror transistor NT32 (e.g., the total amount of the currents flowing through the first and second current mirror transistors NT31 and NT32) may be maintained constant, and thus the sum of the first and second intermediate control signals CMAIN and CAUX may be maintained constant.

The second complementary converter 1210b may include a plurality of second transistors PT21, PT22 and PT23, a plurality of second switches S35, S36 and S37, a third current mirror transistor NT33 and a fourth current mirror transistor NT34.

The plurality of second transistors PT21 to PT23 may have gate electrodes commonly connected to each other, and may have first electrodes connected to the node N30.

The plurality of second switches S35 to S37 may electrically connect the plurality of second transistors PT21 to PT23 with one of a third node N33 and a fourth node N34 based on the second digital control bits CTRLM.

Although FIG. 5 illustrates an example where the number of the plurality of second switches S35 to S37 is equal to the number of the plurality of second transistors PT21 to PT23, example embodiments are not limited thereto. For example, as with the first complementary converter 1210a, the number of the plurality of second switches may be smaller than the number of the plurality of second transistors.

The third current mirror transistor NT33 may be connected between the third node N33 and the ground voltage, and may have a gate electrode connected to the third node N33 to provide the first current control signal I_DAC. The fourth current mirror transistor NT34 may be connected between the fourth node N34 and the ground voltage, and may have a gate electrode connected to the fourth node N34 to provide the second current control signal Q_DAC.

The third complementary converter 1210c may have a configuration substantially the same as that of the second complementary converter 1210b. The third complementary converter 1210c may include a plurality of third transistors PT31, PT32 and PT33, a plurality of third switches S38, S39 and S3A, a fifth current mirror transistor NT35 and a sixth current mirror transistor NT36.

The plurality of third transistors PT31 to PT33 may have gate electrodes commonly connected to each other, and may have first electrodes connected to the node N30.

The plurality of third switches S38 to S3A may electrically connect the plurality of third transistors PT31 to PT33 with one of a fifth node N35 and a sixth node N36 based on the second digital control bits CTRLM or the inverted bits /CTRLM of the second digital control bits CTRLM.

The fifth current mirror transistor NT35 may be connected between the fifth node N35 and the ground voltage, and may have a gate electrode connected to the fifth node N35 to provide the third current control signal I_DACAUX. The sixth current mirror transistor NT36 may be connected between the sixth node N36 and the ground voltage, and may have a gate electrode connected to the sixth node N36 to provide the fourth current control signal Q_DACAUX.

The second and third complementary converters 1210b and 1210c may generate the current control signals I_DAC, Q_DAC, I_DACAUX and Q_DACAUX by adjusting the amount of currents flowing through the current mirror transistors NT33 to NT36 based on controls of the switches S35 to S3A by the second digital control bits CTRLM. The sum of the currents flowing through the current mirror transistors NT33 and NT34 may be maintained constant, and thus the sum of the current control signals I_DAC and Q_DAC may be maintained constant. The sum of the currents flowing through the current mirror transistors NT35 and NT36 may be maintained constant, and thus the sum of the current control signals I_DACAUX and Q_DACAUX may be maintained constant.

The digital-to-analog converter 1040 may further include a first connection circuit that connects the first complementary converter 1210a with the second complementary converter 1210b, and a second connection circuit that connects the first complementary converter 1210a with the third complementary converter 1210c. The first connection circuit may include transistors PT24 and NT37 connected in series between the node N30 and the ground voltage. A gate electrode of the transistor PT24 may be connected to the gate electrodes of the second transistors PT21 to PT23 and a second electrode of the transistor PT24, and a gate electrode of the transistor NT37 may be connected to the gate electrode of the first current mirror transistor NT31 to receive the first intermediate control signal CMAIN. The second connection circuit may include transistors PT34 and NT38 connected in series between the node N30 and the ground voltage. A gate electrode of the transistor PT34 may be connected to the gate electrodes of the third transistors PT31 to PT33 and a second electrode of the transistor PT34, and a gate electrode of the transistor NT38 may be connected to the gate electrode of the second current mirror transistor NT32 to receive the second intermediate control signal CAUX.

Although FIG. 5 illustrates an example where the transistors PT11 to PT16, PT21 to PT24 and PT31 to PT34 are p-type metal oxide semiconductor (PMOS) transistors and the transistors NT31 to NT38 are NMOS transistors, the types of transistors included in the digital-to-analog converter 1040 may be changed according to example embodiments.

In some example embodiments, the types and numbers of the transistors PT11 to PT16, PT21 to PT24, PT31 to PT34 and NT31 to NT38 and the switches S31 to S3A included in the digital-to-analog converter 1040 may be changed.

Although FIG. 5 illustrates an example where the first and second current control signals I_DAC and Q_DAC are generated by one complementary converter 1210b and the third and fourth current control signals I_DACAUX and Q_DACAUX are generated by another complementary converter 1210c, example embodiments are not limited thereto. For example, the first and third current control signals I_DAC and I_DACAUX may be generated by one complementary converter, and the second and fourth current control signals Q_DAC and Q_DACAUX may be generated by another complementary converter. The complementary converter included in the digital-to-analog converter according to example embodiments may be referred to as a differential converter.

Figure 6:
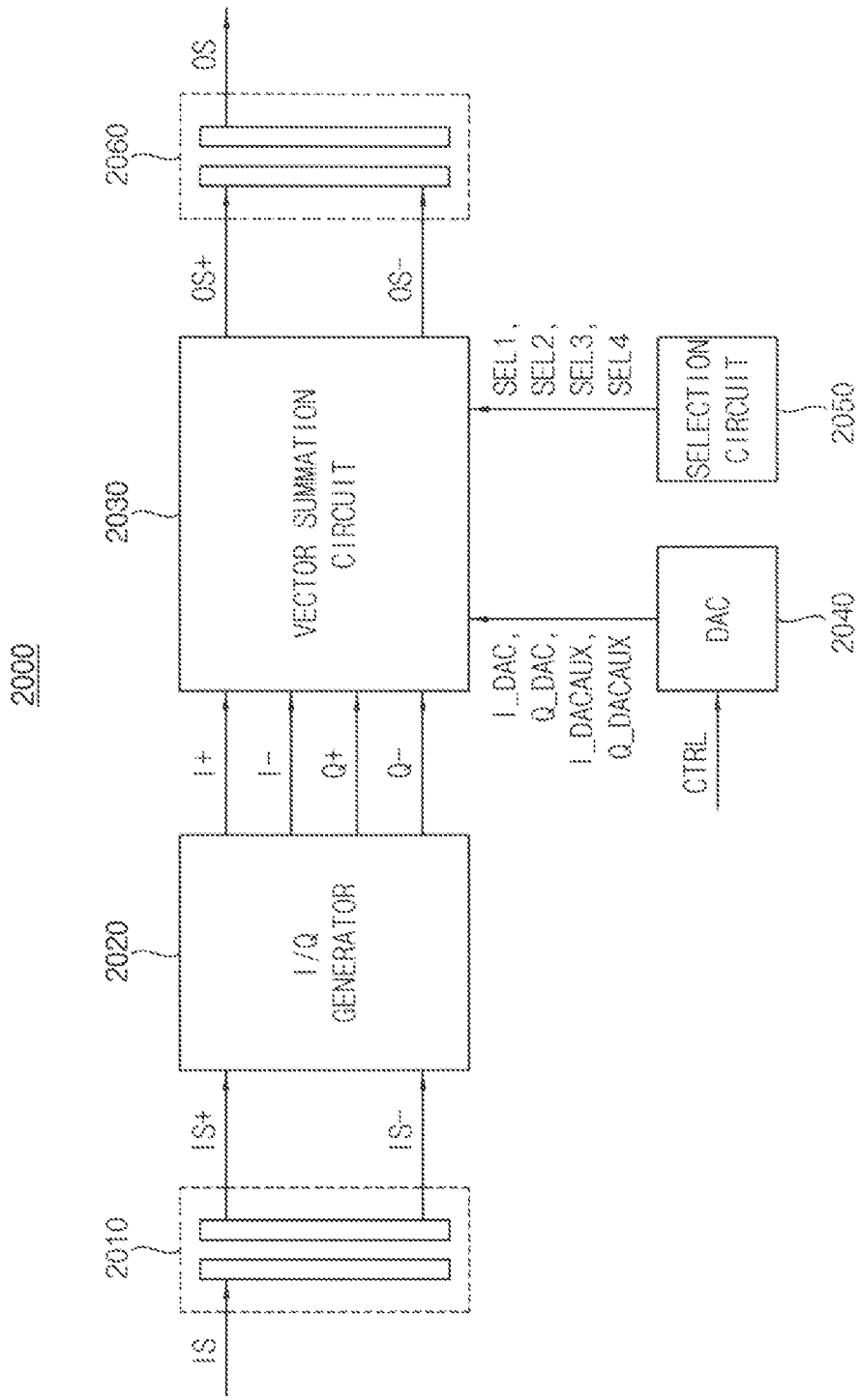
FIG. 6 is a block diagram illustrating a variable gain phase shifter according to example embodiments.

FIG. 6 is a block diagram illustrating a variable gain phase shifter according to example embodiments.

Referring to FIG. 6, a variable gain phase shifter 2000 includes an I/Q generator 2020 and a vector summation circuit 2030. The variable gain phase shifter 2000 may further include a first transmission line transformer 2010, a digital-to-analog converter 2040, a selection circuit 2050 and a second transmission line transformer 2060.

The variable gain phase shifter 2000 of FIG. 6 may be substantially the same as the variable gain phase shifter 1000 of FIG. 1, except that a configuration of the vector summation circuit 2030 is changed and then the selection circuit 2050 is changed. The first transmission line transformer 2010, the I/Q generator 2020, the digital-to-analog converter 2040 and the second transmission line transformer 2060 in FIG. 6 may be substantially the same as the first transmission line transformer 1010, the I/Q generator 1020, the digital-to-analog converter 1040 and the second transmission line transformer 1060 in FIG. 1, respectively.

The vector summation circuit 2030 adjusts magnitudes and directions of first, second, third and fourth in-phase vectors and first, second, third and fourth quadrature vectors, and generates first and second differential output signals OS+ and OS− corresponding to an output signal OS by summing the first, second, third and fourth in-phase vectors and the first, second, third and fourth quadrature vectors, based on the first, second, third and fourth phase signals I+, I−, Q+ and Q−, first, second, third and fourth selection signals SEL1, SEL2, SEL3 and SEL4 and first, second, third and fourth current control signals I_DAC, Q_DAC, I_DACAUX and Q_DACAUX. A detailed configuration of the vector summation circuit 2030 will be described later with reference to FIGS. 7A and 7B.

The first, second, third and fourth in-phase vectors may be vectors having in-phase components, and may have the same direction or opposite directions. The first, second, third and fourth quadrature vectors may be vectors having quadrature components, and may have the same direction or opposite directions. The vector summation circuit 2030 may determine the directions of the first, second, third and fourth in-phase vectors and the first, second, third and fourth quadrature vectors based on the first, second, third and fourth selection signals SEL1, SEL2, SEL3 and SEL4, and may adjust the amount of first, second, third and fourth currents corresponding to the first, second, third and fourth in-phase vectors and the first, second, third and fourth quadrature vectors based on the first, second, third and fourth current control signals I_DAC, Q_DAC, I_DACAUX and Q_DACAUX. Thus, the vector summation circuit 2030 may independently control a phase and a gain of the output signal OS at once.

The selection circuit 1050 may generate the first, second, third and fourth selection signals SEL1, SEL2, SEL3 and SEL4.

Figure 7A:
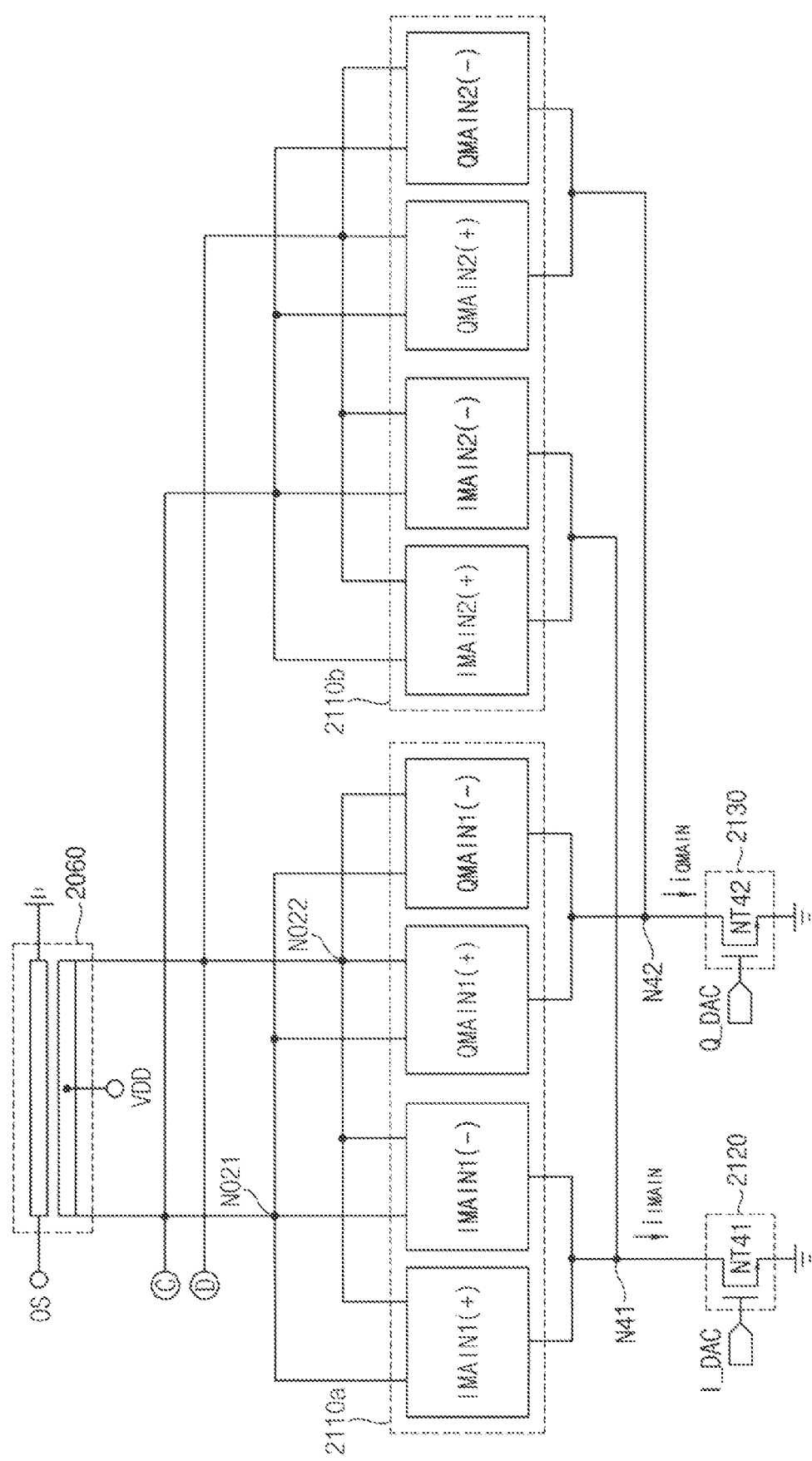
FIGS. 7A and 7B are circuit diagrams illustrating a vector summation circuit included in a variable gain phase shifter according to example embodiments.
Figure 7B:
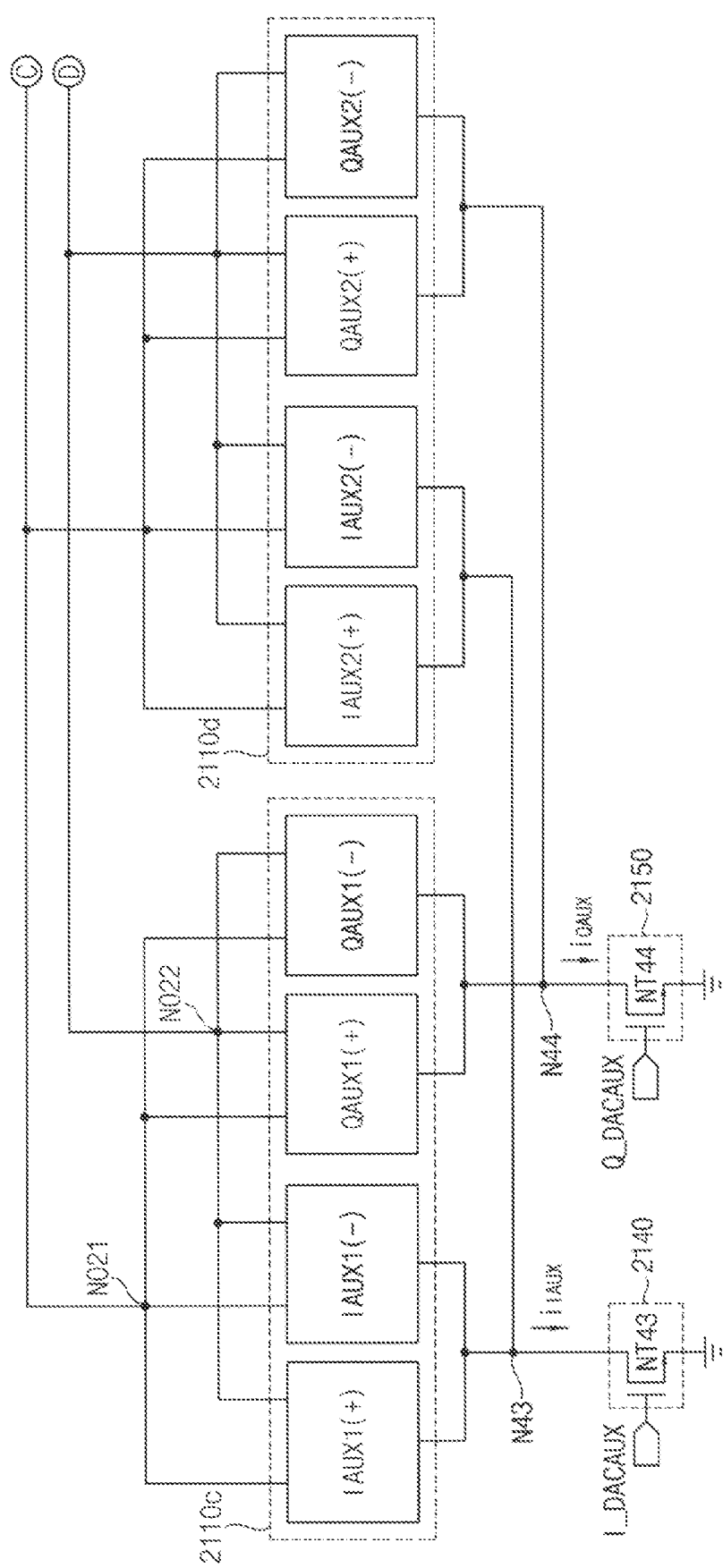

FIGS. 7A and 7B are circuit diagrams illustrating a vector summation circuit included in a variable gain phase shifter according to example embodiments.

Referring to FIGS. 6, 7A and 7B, the vector summation circuit 2030 includes a first vector summation cell 2110a, a second vector summation cell 2110b, a third vector summation cell 2110c, a fourth vector summation cell 2110d, a first current control circuit 2120, a second current control circuit 2130, a third current control circuit 2140 and a fourth current control circuit 2150.

The first vector summation cell 2110a is connected to the first and second current control circuits 2120 and 2130, receives the first, second, third and fourth phase signals I+, I−, Q+ and Q−, the first and second current control signals I_DAC and Q_DAC and the first selection signal SEL1, and adjusts the directions of the first in-phase vector and the first quadrature vector based on the first selection signal SEL1. The second vector summation cell 2110b is connected to the first and second current control circuits 2120 and 2130, receives the first, second, third and fourth phase signals I+, I−, Q+ and Q−, the first and second current control signals I_DAC and Q_DAC and the second selection signal SEL2, and adjusts the directions of the second in-phase vector and the second quadrature vector based on the second selection signal SEL2.

The first current control circuit 2120 is connected to the first and second vector summation cells 2110a and 2110b, and adjusts the amount of a first current $i_{IMAIN}$ corresponding to the first and second in-phase vectors based on the first current control signal I_DAC. The second current control circuit 2130 is connected to the first and second vector summation cells 2110a and 2110b, and adjusts the amount of a second current $i_{QMAIN}$ corresponding to the first and second quadrature vectors based on the second current control signal Q_DAC.

The first vector summation cell 2110a may include four vector circuits IMAIN1(+), IMAIN1(−), QMAIN1(+) and QMAIN1(−), and the second vector summation cell 2110b may include four vector circuits IMAIN2(+), IMAIN2(−), QMAIN2(+) and QMAIN2(−). Each of the vector circuits IMAIN1(+) and IMAIN2(+) may have a configuration substantially the same as that of the first vector circuit IMAIN(+) in FIG. 2A, each of the vector circuits IMAIN1(−) and IMAIN2(−) may have a configuration substantially the same as that of the second vector circuit IMAIN(−) in FIG. 2A, each of the vector circuits QMAIN1(+) and QMAIN2(+) may have a configuration substantially the same as that of the third vector circuit QMAIN(+) in FIG. 2A, and each of the vector circuits QMAIN1(−) and QMAIN2(−) may have a configuration substantially the same as that of the fourth vector circuit QMAIN(−) in FIG. 2A. The first and second vector summation cells 2110a and 2110b may be connected in parallel between first and second output nodes NO21 and NO22 and nodes N41 and N42.

The first current control circuit 2120 may include a first current control transistor NT41 that is connected between the node N41 and a ground voltage and has a gate electrode receiving the first current control signal I_DAC. The second current control circuit 2130 may include a second current control transistor NT42 that is connected between the node N42 and the ground voltage and has a gate electrode receiving the second current control signal Q_DAC. The first and second vector summation cells 2110a and 2110b may be commonly connected to the nodes N41 and N42, and thus may be commonly connected to the first and second current control circuits 2120 and 2130.

The third vector summation cell 2110c is connected to the third and fourth current control circuits 2140 and 2150, receives the first, second, third and fourth phase signals I+, I−, Q+ and Q−, the third and fourth current control signals I_DACAUX and Q_DACAUX and the third selection signal SEL3, and adjusts the directions of the third in-phase vector and the third quadrature vector based on the third selection signal SEL3. The fourth vector summation cell 2110d is connected to the third and fourth current control circuits 2140 and 2150, receives the first, second, third and fourth phase signals I+, I−, Q+ and Q−, the third and fourth current control signals I_DACAUX and Q_DACAUX and the fourth selection signal SEL4, and adjusts the directions of the fourth in-phase vector and the fourth quadrature vector based on the fourth selection signal SEL4.

The third current control circuit 2140 is connected to the third and fourth vector summation cells 2110c and 2110d, and adjusts the amount of a third current $i_{IAUX}$ corresponding to the third and fourth in-phase vectors based on the third current control signal I_DACAUX. The fourth current control circuit 2150 is connected to the third and fourth vector summation cells 2110c and 2110d, and adjusts the amount of a fourth current $i_{QAUX}$ corresponding to the third and fourth quadrature vectors based on the fourth current control signal Q_DACAUX.

The third vector summation cell 2110c may include four vector circuits IAUX1(+), IAUX1(−), QAUX1(+) and QAUX1(−), and the fourth vector summation cell 2110d may include four vector circuits IAUX2(+), IAUX2(−), QAUX2(+) and QAUX2(−). Each of the vector circuits IAUX1(+) and IAUX2(+) may have a configuration substantially the same as that of the fifth vector circuit IAUX(+) in FIG. 2B, each of the vector circuits IAUX1(−) and IAUX2(−) may have a configuration substantially the same as that of the sixth vector circuit IAUX(−) in FIG. 2B, each of the vector circuits QAUX1(+) and QAUX2(+) may have a configuration substantially the same as that of the seventh vector circuit QAUX(+) in FIG. 2B, and each of the vector circuits QAUX1(−) and QAUX2(−) may have a configuration substantially the same as that of the eighth vector circuit QAUX(−) in FIG. 2B. The third and fourth vector summation cells 2110c and 2110d may be connected in parallel between the first and second output nodes NO21 and NO22 and the nodes N41 and N42.

The third current control circuit 2140 may include a third current control transistor NT43 that is connected between the node N43 and the ground voltage and has a gate electrode receiving the third current control signal I_DACAUX. The fourth current control circuit 2150 may include a fourth current control transistor NT44 that is connected between the node N44 and the ground voltage and has a gate electrode receiving the second current control signal Q_DACAUX. The third and fourth vector summation cells 2110c and 2110d may be commonly connected to the nodes N43 and N44, and thus may be commonly connected to the third and fourth current control circuits 2140 and 2150.

The first, second, third and fourth vector summation cells 2110a, 2110b, 2110c and 2110d are commonly connected to the first and second output nodes NO21 and NO22, and generate the first and second differential output signals OS+ and OS− based on the first, second, third and fourth in-phase vectors and the first, second, third and fourth quadrature vectors, e.g., based on the first, second, third and fourth currents $i_{IMAIN}$, $i_{QMAIN}$, $i_{IAUX}$ and $i_{QAUX}$. The first and second output nodes NO21 and NO22 may output the first and second differential output signals OS+ and OS−, and may be connected to the second transmission line transformer 2060. A power supply voltage VDD may be applied to the second transmission line transformer 2060.

In some example embodiments, a size of the first vector summation cell 2110a may be substantially the same as a size of the third vector summation cell 2110c (e.g., MAIN1=AUX1), and a size of the second vector summation cell 2110b may be substantially the same as a size of the fourth vector summation cell 2110d (e.g., MAIN2=AUX2). A size of the vector summation cell may be determined by a size (e.g., a channel width, a channel length, or the like) of the transistor included in the vector summation cell. In other example embodiments, a first ratio between the size of the first vector summation cell 2110a and the size of the third vector summation cell 2110c may be substantially the same as a second ratio between the size of the second vector summation cell 2110b and the size of the fourth vector summation cell 2110d (e.g., MAIN1:AUX1=MAIN2: AUX2). In this example, a magnitude ratio between the first in-phase vector and the second in-phase vector and a magnitude ratio between the first quadrature vector and the second quadrature vector may be determined based on the size ratio between the first vector summation cell 2110a and the second vector summation cell 2110b. Similarly, a magnitude ratio between the third in-phase vector and the fourth in-phase vector and a magnitude ratio between the third quadrature vector and the fourth quadrature vector may be determined based on the size ratio between the third vector summation cell 2110c and the fourth vector summation cell 2110d.

When the sizes of the vector summation cells are determined as described above, it may be seen a relatively large gain change occurs if the directions of the second in-phase vector and the second quadrature vector determined by the second vector summation cell 2110b are opposite to or reversed with the directions of the first in-phase vector and the first quadrature vector determined by the first vector summation cell 2110a. For example, when the size ratio between the first vector summation cell 2110a and the second vector summation cell 2110b is about 3:1, the total effective current may be reduced by about a half and the gain of about 6 dB may be reduced if the directions of the vectors are reversed as described above, as compared with an example where the vectors have the same direction. The same characteristics may be derived for the third vector summation cell 2110c and the fourth vector summation cell 2110d.

Using the above-described characteristics, the most significant bit (MSB) portion of the gain adjustment may be controlled by differently setting the sizes of two vector summation cells (e.g., the vector summation cells 2110a and 2110b) commonly connected to the two current control circuits (e.g., the current control circuits 2120 and 2130), and the least significant bit (LSB) portion of the gain adjustment may be controlled by adjusting the first, second, third and fourth currents $i_{IMAIN}$, $i_{QMAIN}$, $i_{IAUX}$ and $i_{QAUX}$ as described above with reference to FIGS. 3A and 3B, thereby efficiently increasing both the dynamic range and the resolution of the gain adjustment.

In the variable gain phase shifter 2000 according to example embodiments, all the first, second, third and fourth in-phase vectors and all the first, second, third and fourth quadrature vectors may be used for the phase adjustment and the gain adjustment. For example, the magnitudes and directions of such vectors may be adjusted based on the selection signals SEL1, SEL2, SEL3 and SEL4 and the current control signals I_DAC, Q_DAC, I_DACAUX and Q_DACAUX, and the output signal OS may be generated by summing such vectors of which the magnitudes and directions are adjusted, thereby independently controlling the phase and the gain of the output signal OS at once. Particularly, as with the vector summation circuit 1030 in FIGS. 2A and 2B, the vector summation circuit 2030 may be implemented based on the current separation scheme. In addition, the vector summation circuit 2030 may be implemented based on a cell separation scheme such that one vector summation cell is divided into two vector summation cells (e.g., the vector summation cells 2110a and 2110b) commonly connected to the two current control circuits (e.g., the current control circuits 2120 and 2130). Accordingly, the variable gain phase shifter 2000 may have relatively high dynamic range and high resolution.

FIG. 8 is a diagram for describing an operation of a vector summation circuit included in a variable gain phase shifter according to example embodiments.

Referring to FIGS. 7A, 7B and 8, the gain of the output signal OS may be adjusted according to direction of first, second, third and fourth in-phase vectors VIM1, VIM2, VIA1 and VIA2 and first, second, third and fourth quadrature vectors VQM1, VQM2, VQA1 and VQA2. Hereinafter, examples will be described based on the gain adjustment in a first quadrant.

In an example of FIG. 8, it is assumed that the size decreases in an order of the first vector summation cell 2110a, the second vector summation cell 2110b, the third vector summation cell 2110c and the fourth vector summation cell 2110d. In other words, the first vector summation cell 2110a may have the largest size and the fourth vector summation cell 2110d may have the smallest size. (e.g., the size ratio of the first, second, third and fourth vector summation cells 2110a, 2110b, 2110c and 2110d is about 27:9:3:1).

When all the first, second, third and fourth in-phase vectors VIM1, VIM2, VIA1 and VIA2 and the first, second, third and fourth quadrature vectors VQM1, VQM2, VQA1 and VQA2 have a forward direction as illustrated by a first example GAIN_MAX, the output signal OS may have the maximum gain.

When the first and second in-phase vectors VIM1 and VIM2 and the first and second quadrature vectors VQM1 and VQM2 have a forward direction and the third and fourth in-phase vectors VIA1 and VIA2 and the third and fourth quadrature vectors VQA1 and VQA2 have a reverse direction as illustrated by a second example GAIN_M1, the output signal OS may have a gain smaller than that of the first example GAIN_MAX.

When the first and third in-phase vectors VIM1 and VIA1 and the first and third quadrature vectors VQM1 and VQA1 have a forward direction and the second and fourth in-phase vectors VIM2 and VIA2 and the second and fourth quadrature vectors VQM2 and VQA2 have a reverse direction as illustrated by a third example GAIN M2, the output signal OS may have a gain smaller than that of the second example GAIN_M1.

When the first and fourth in-phase vectors VIM1 and VIA2 and the first and fourth quadrature vectors VQM1 and VQA2 have a forward direction and the second and third in-phase vectors VIM2 and VIA1 and the second and third quadrature vectors VQM2 and VQA1 have a reverse direction as illustrated by a fourth example GAIN MIN, the output signal OS may have the minimum gain.

Although not illustrated in FIG. 8, the gain adjustment may be performed in second, third and fourth quadrants by adjusting the directions of the vectors in a similar manner.

Figure 9:
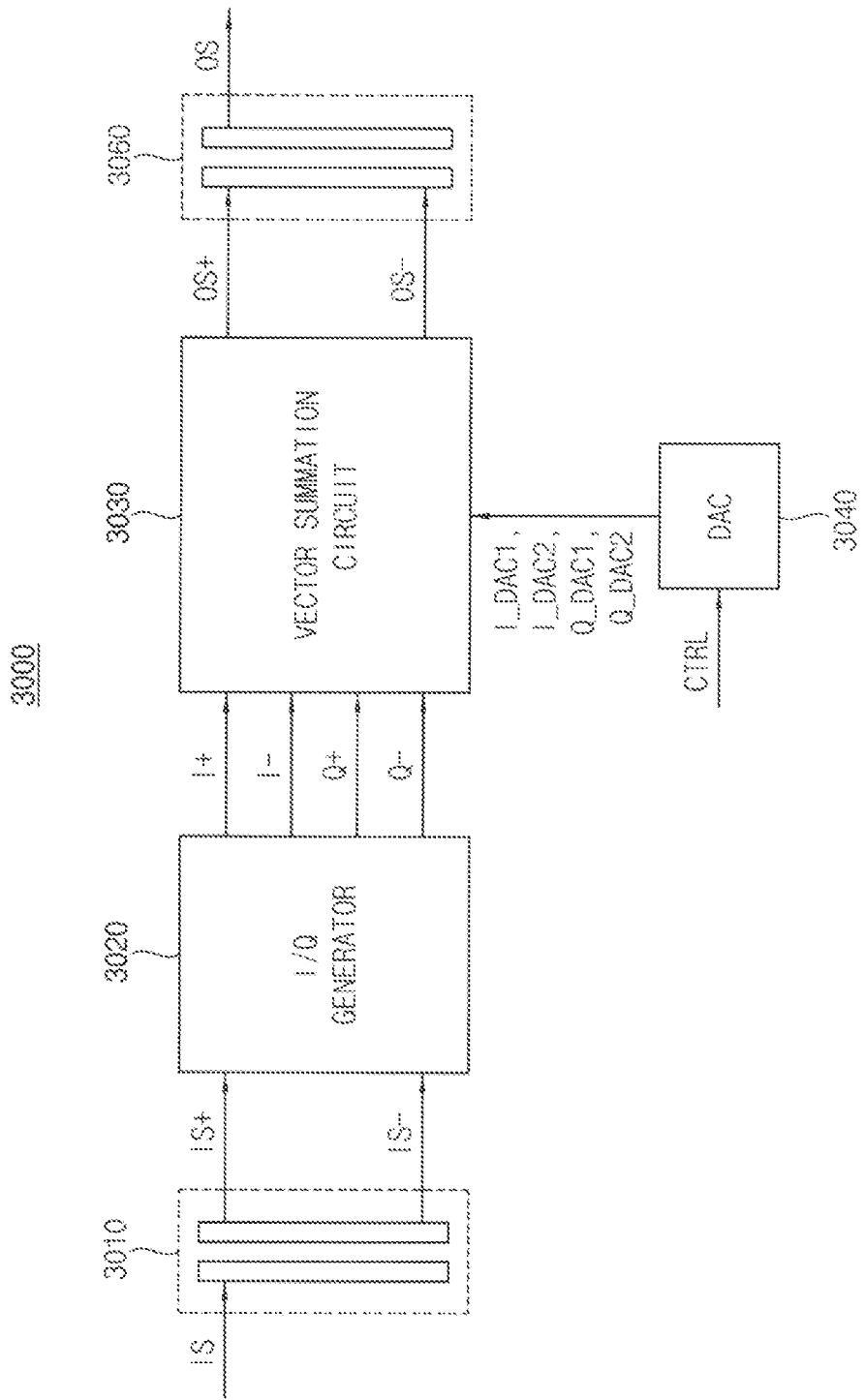
FIG. 9 is a block diagram illustrating a variable gain phase shifter according to example embodiments.

FIG. 9 is a block diagram illustrating a variable gain phase shifter according to example embodiments.

Referring to FIG. 9, a variable gain phase shifter 3000 includes an in-phase/quadrature (I/Q) generator 3020 and a vector summation circuit 3030. The variable gain phase shifter 3000 may further include a first transmission line transformer (TLT) 3010, a digital-to-analog converter (DAC) 3040 and a second transmission line transformer 3060.

The first transmission line transformer 3010 may generate first and second differential input signals IS+ and IS– based on an input signal IS. For example, the first differential input signal IS+ may have a phase substantially the same as that of the input signal IS (e.g., a phase difference between the input signal IS and the first differential input signal IS+ may be about 0 degree), and a phase difference between the input signal IS and the second differential input signal IS− may be about 180 degrees. The first transmission line transformer 3010 may perform functions of a balanced-to-unbalanced (BALUN) and an impedance matching network.

The I/Q generator 3020 generates first, second, third and fourth phase signals I+, I−, Q+ and Q− based on the input signal IS, e.g., based on the first and second differential input signals IS+ and IS− corresponding to the input signal IS. For example, the first phase signal I+ may have a phase substantially the same as that of the input signal IS (e.g., a phase difference between the input signal IS and the first phase signal I+ may be about 0 degree), a phase difference between the input signal IS and the second phase signal I− may be about 180 degrees, a phase difference between the input signal IS and the third phase signal Q+ may be about 90 degrees, and a phase difference between the input signal IS and the fourth phase signal Q− may be about 270 degrees. A detailed configuration of the I/Q generator 3020 will be described later with reference to FIG. 17.

Each of the first and second phase signals I+ and I− having the phase difference of about 0 degree and about 180 degrees with respect to the input signal IS may be referred to as a signal having an in-phase component or simply an in-phase signal. Each of the third and fourth phase signals Q+ and Q− having the phase difference of about 90 degree and about 270 degrees with respect to the input signal IS may be referred to as a signal having a quadrature component or simply a quadrature signal.

The vector summation circuit 3030 adjusts magnitudes of first, second, third and fourth vectors, and generates first and second differential output signals OS+ and OS− corresponding to an output signal OS by summing the first, second, third and fourth vectors, based on the first, second, third and fourth phase signals I+, I−, Q+ and Q− and first, second, third and fourth current control signals I_DAC1, I_DAC2, Q_DAC1 and Q_DAC2. A detailed configuration of the vector summation circuit 3030 will be described later with reference to FIG. 10.

As will be described later with reference to FIGS. 11A and 11B, the first and second vectors may be vectors having in-phase components or in-phase vectors, and may have opposite directions. The third and fourth vectors may be vectors having quadrature components or quadrature vectors, and may have opposite directions. The vector summation circuit 3030 may adjust the amount of first, second, third and fourth currents corresponding to the first, second, third and fourth vectors based on the first, second, third and fourth current control signals I_DAC1, I_DAC2, Q_DAC1 and Q_DAC2. Thus, the vector summation circuit 3030 may independently control a phase and a gain of the output signal OS at once.

The digital-to-analog converter 3040 may generate the first, second, third and fourth current control signals I_DAC1, I_DAC2, Q_DAC1 and Q_DAC2 based on digital control bits CTRL. A detailed configuration of the digital-to-analog converter 3040 will be described later with reference to FIGS. 12 through 16.

The second transmission line transformer 3060 may generate the output signal OS based on the first and second differential output signals OS+ and OS−. For example, a phase difference between the first and second differential output signals OS+ and OS− may be about 180 degrees. As with the first transmission line transformer 3010, the second transmission line transformer 3060 may perform the functions of the balanced-to-unbalanced and the impedance matching network.

The variable gain phase shifter according to example embodiments may be referred to as a vector modulator.

Figure 10:
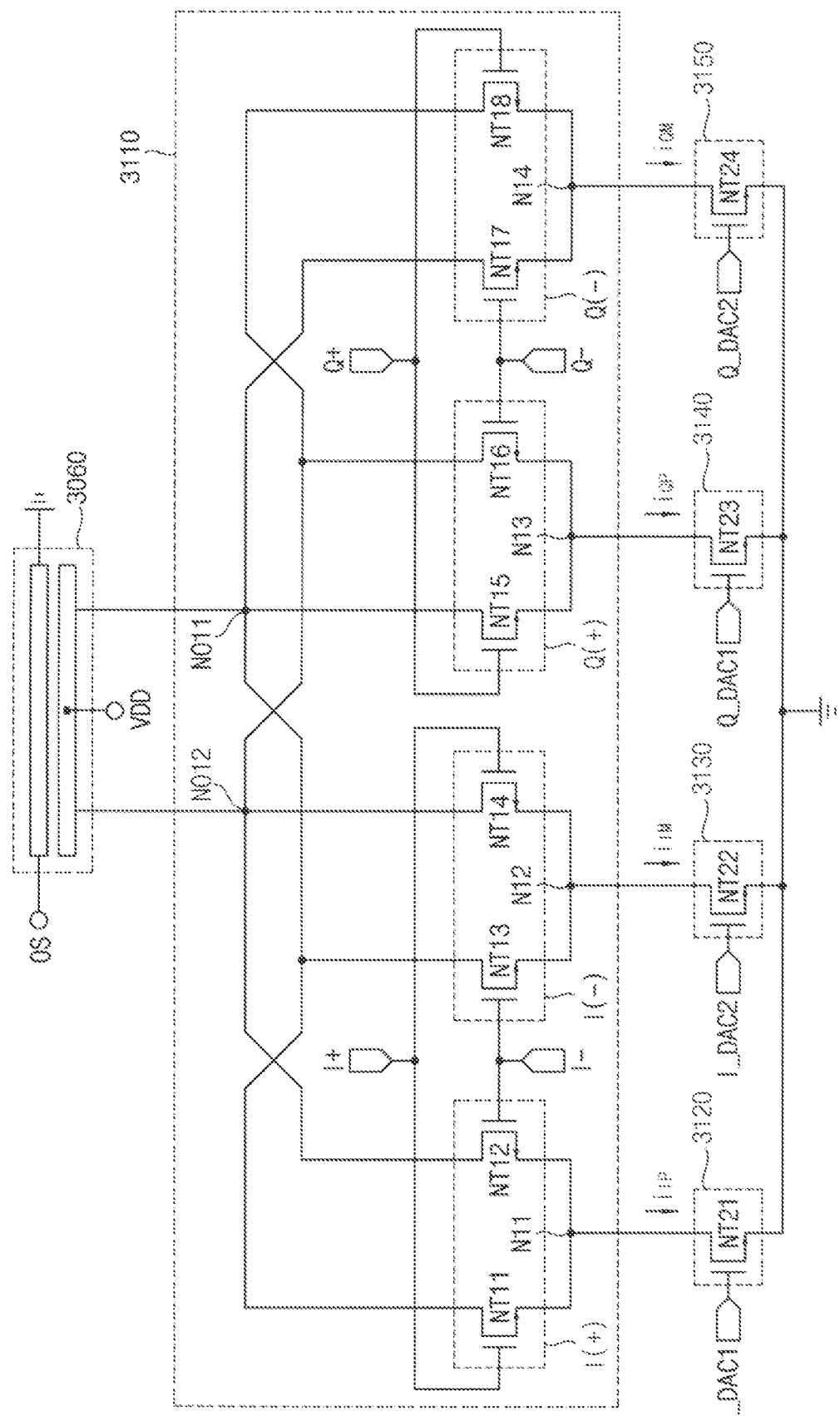
FIG. 10 is a circuit diagram illustrating a vector summation circuit included in a variable gain phase shifter according to example embodiments.

FIG. 10 is a circuit diagram illustrating a vector summation circuit included in a variable gain phase shifter according to example embodiments.

Referring to FIGS. 9 and 10, the vector summation circuit 3030 includes a vector summation cell 3110, a first current control circuit 3120, a second current control circuit 3130, a third current control circuit 3140 and a fourth current control circuit 3150.

The first current control circuit 3120 adjusts the amount of a first current $i_{IP}$ corresponding to the first vector based on one of the first and second current control signals I_DAC1 and I_DAC2. The second current control circuit 3130 adjusts the amount of a second current $i_{IM}$ corresponding to the second vector based on the other one of the first and second current control signals I_DAC1 and I_DAC2. FIG. 10 illustrates an example where the first current control circuit 3120 operates in response to the first current control signal I_DAC1 and the second current control circuit 3130 operates in response to the second current control signal I_DAC2.

The third current control circuit 3140 adjusts the amount of a third current $i_{QP}$ corresponding to the third vector based on one of the third and fourth current control signals Q_DAC1 and Q_DAC2. The fourth current control circuit 3150 adjusts the amount of a fourth current $i_{QM}$ corresponding to the fourth vector based on the other one of the third and fourth current control signals Q_DAC1 and Q_DAC2. FIG. 10 illustrates an example where the third current control circuit 3140 operates in response to the third current control signal Q_DAC1 and the fourth current control circuit 3150 operates in response to the fourth current control signal Q_DAC2.

Each of the first, second, third and fourth current control circuits 3120, 3130, 3140 and 3150 may include one transistor. For example, the first current control circuit 3120 may include a first current control transistor NT61 that is connected between a first node N51 and a ground voltage (e.g., a VSS or GND voltage) and has a gate electrode receiving the one of the first and second current control signals I_DAC1 and I_DAC2. The second current control circuit 3130 may include a second current control transistor NT62 that is connected between a second node N52 and the ground voltage and has a gate electrode receiving the other one of the first and second current control signals I_DAC1 and I_DAC2.

Similarly, the third current control circuit 3140 may include a third current control transistor NT63 that is connected between a third node N53 and the ground voltage and has a gate electrode receiving the one of the third and fourth current control signals Q_DAC1 and Q_DAC2. The fourth current control circuit 3150 may include a fourth current control transistor NT64 that is connected between a fourth node N54 and the ground voltage and has a gate electrode receiving the other one of the third and fourth current control signals Q_DAC1 and Q_DAC2.

The vector summation cell 3110 is connected to all the first, second, third and fourth current control circuits 3120, 3130, 3140 and 3150, receives the first, second, third and fourth phase signals I+, I−, Q+ and Q−, and generates the first and second differential output signals OS+ and OS− based on the first, second, third and fourth currents $i_{IP}$, $i_{IM}$, $i_{QP}$ and $i_{QM}$.

The vector summation cell 3110 may include a first vector circuit I(+), a second vector circuit I(−), a third vector circuit Q(+) and a fourth vector circuit Q(−). The first vector circuit I(+) may be connected between first and second output nodes NO51 and NO52 and the first node N51, and may receive the first and second phase signals I+ and I−. The second vector circuit I(−) may be connected between the first and second output nodes NO51 and NO52 and the second node N52, and may receive the first and second phase signals I+ and I−. The third vector circuit Q(+) may be connected between the first and second output nodes NO51 and NO52 and the third node N53, and may receive the third and fourth phase signals Q+ and Q−. The fourth vector circuit Q(−) may be connected between the first and second output nodes NO51 and NO52 and the fourth node N54, and may receive the third and fourth phase signals Q+ and Q−.

Each of the first, second, third and fourth vector circuits I(+), I(−), Q(+) and Q(−) may include two transistors. For example, the first vector circuit I(+) may include a first transistor NT51 and a second transistor NT52. The first transistor NT51 may be connected between the first output node NO51 and the first node N51, and may have a gate electrode receiving the first phase signal I+. The second transistor NT52 may be connected between the second output node NO52 and the first node N51, and may have a gate electrode receiving the second phase signal I−. The second vector circuit I(−) may include a third transistor NT53 and a fourth transistor NT54. The third transistor NT53 may be connected between the first output node NO51 and the second node N52, and may have a gate electrode receiving the second phase signal I−. The fourth transistor NT54 may be connected between the second output node NO52 and the second node N52, and may have a gate electrode receiving the first phase signal I+.

Similarly, the third vector circuit Q(+) may include a fifth transistor NT55 and a sixth transistor NT56. The fifth transistor NT55 may be connected between the first output node NO51 and the third node N53, and may have a gate electrode receiving the third phase signal Q+. The sixth transistor NT56 may be connected between the second output node NO52 and the third node N53, and may have a gate electrode receiving the fourth phase signal Q−. The fourth vector circuit Q(−) may include a seventh transistor NT57 and an eighth transistor NT58. The seventh transistor NT57 may be connected between the first output node NO51 and the fourth node N54, and may have a gate electrode receiving the fourth phase signal Q−. The eighth transistor NT58 may be connected between the second output node NO52 and the fourth node N54, and may have a gate electrode receiving the third phase signal Q+.

The first and second output nodes NO51 and NO52 may output the first and second differential output signals OS+ and OS−, respectively, and may be connected to the second transmission line transformer 3060. A power supply voltage VDD may be applied to the second transmission line transformer 3060.

Although FIG. 10 illustrates an example where all the transistors NT51 to NT58 and NT61 to NT64 are n-type metal oxide semiconductor (NMOS) transistors, the types and numbers of transistors included in the vector summation circuit 3030 may be changed according to example embodiments.

In a conventional phase shifter, only one of two vectors having in-phase components and different directions is selected, only one of two vectors having quadrature components and different directions is selected, and the selected vectors are summed to generate an output signal. The conventional phase shifter is effective for the phase adjustment (or control), however, has difficulty in the gain adjustment (or control).

In the variable gain phase shifter 3000 according to example embodiments, both the first and second vectors having in-phase components and both the first and second vectors having quadrature components may be used for the phase adjustment and the gain adjustment. For example, the magnitudes of such vectors may be adjusted based on the current control signals I_DAC1, I_DAC2, Q_DAC1 and Q_DAC2, and the output signal OS may be generated by summing such vectors of which the magnitudes are adjusted, thereby independently controlling the phase and the gain of the output signal OS at once using one block. Particularly, the vector summation circuit 3030 may be implemented with one vector summation cell 3110 and four current control circuits 3120, 3130, 3140 and 3150 connected thereto, and a selection circuit for selecting vectors (e.g., for determining directions of vectors) may be omitted. Accordingly, the size and manufacturing cost of the variable gain phase shifter 3000 may be reduced.

Figure 11A:
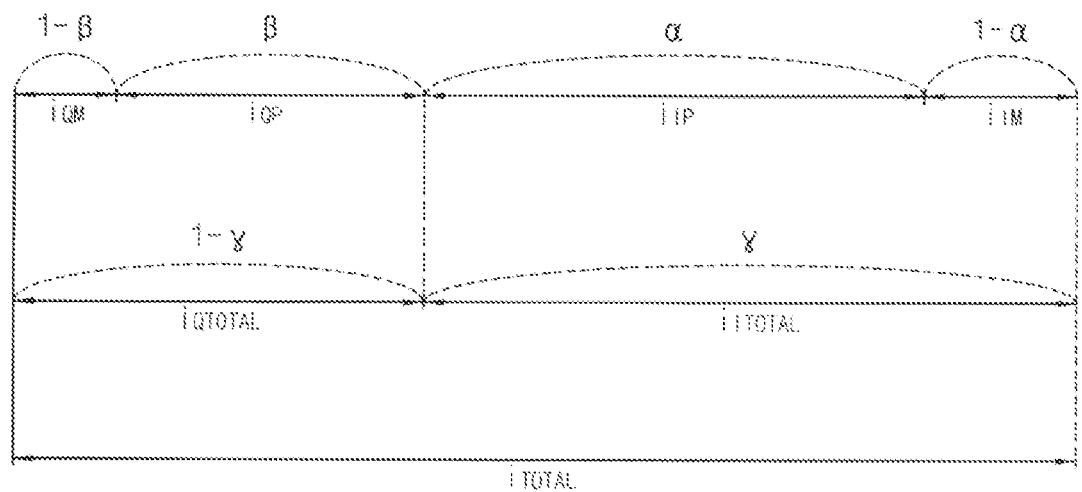
FIGS. 11A and 11B are diagrams for describing an operation of a vector summation circuit included in a variable gain phase shifter according to example embodiments.
Figure 11B:
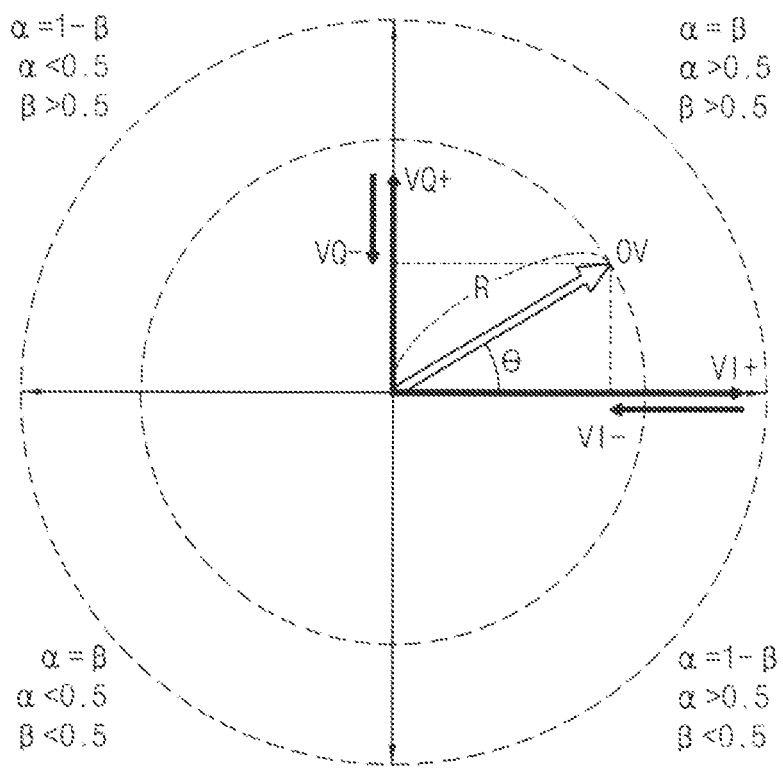

FIGS. 11A and 11B are diagrams for describing an operation of a vector summation circuit included in a variable gain phase shifter according to example embodiments.

Referring to FIGS. 10 and 11A, the first vector circuit I(+) and the first current control circuit 3120 may provide a first path corresponding to the first vector and the first current $i_{IP}$. The second vector circuit I(−) and the second current control circuit 3130 may provide a second path corresponding to the second vector and the second current $i_{IM}$. The first vector may have the in-phase component and a first direction (e.g., a forward direction), and the second vector may have the in-phase component and a second direction (e.g., a reverse direction) opposite to the first direction. The third vector circuit Q(+) and the third current control circuit 3140 may provide a third path corresponding to the third vector and the third current $i_{QP}$. The fourth vector circuit Q(−) and the fourth current control circuit 3150 may provide a fourth path corresponding to the fourth vector and the fourth current $i_{QM}$. The third vector may have the quadrature component and a third direction (e.g., a forward direction), and the fourth vector may have the quadrature component and a fourth direction (e.g., a reverse direction) opposite to the third direction.

As described above, unlike the conventional phase shifter, all the four paths may be simultaneously or concurrently used in the variable gain phase shifter according to example embodiments, and the gain adjustment may also be performed using the magnitude of the vector having the reverse direction. In addition, the total amount of a current flowing through the vector summation circuit 3030 may be maintained constant to maintain an output impedance to the same value, and the amount of a current flowing through each path may be distributed or divided with an appropriate ratio, thereby independently controlling the phase and the gain of the output signal OS.

For example, as illustrated in FIG. 11A, the first, second, third and fourth currents lip, $i_{IM}$, $i_{QP}$ and $i_{QM}$ may satisfy following Equation 5, Equation 6, Equation 7, Equation 8, Equation 9, Equation 10 and Equation 11.

$$i_{IP} + i_{IM} = i_{ITOTAL} \qquad [\text{Equation 5}]$$

$$i_{QP} + i_{QM} = i_{QTOTAL} \qquad [\text{Equation 6}]$$

$$i_{IP} : i_{IM} = \alpha : (1-\alpha) \ (0 \le \alpha \le 1) \qquad [\text{Equation 7}]$$

$$I_{QP} : i_{QM} = \beta : (1-\beta) \ (0 \le \beta \le 1) \qquad [\text{Equation 8}]$$

$$\alpha = \beta \text{ or} (1-\beta) \qquad [\text{Equation 9}]$$

$$i_{ITOTAL}:i_{QTOTAL}=\gamma:(1-\gamma)(0\leq\gamma\leq1)$$ [Equation 10]

$$i_{ITOTAL}+i_{QTOTAL}=i_{TOTAL}$$ [Equation 11]

As described above, since all the four paths are simultaneously used in the variable gain phase shifter according to example embodiments, the forward direction component (e.g., the first vector by the first current $i_{IP}$ and the third vector by the third current $i_{QP}$) and the reverse direction component (e.g., the second vector by the second current $i_{IM}$ and the fourth vector by the fourth current $i_{QM}$) may coexist for each of the in-phase component and the quadrature component. These reverse direction components may be used to control the magnitude of the power gain by attenuating the magnitude of the signal.

From a basic formula of metal oxide semiconductor (MOS) transistors, $i_{OUT}=gm*v_{IN}$ may be satisfied for a small signal $\text{V}_{IN}$ input to a gate electrode, and gm may be proportional to a square root of a direct current (DC) in the transistor (e.g., gm $\propto(I_D)^{1/2}$). Thus, magnitudes of a first vector VI+, a second vector VI−, a third vector VQ+ and a fourth vector VQ− illustrated in FIG. 11B may satisfy following Equation 12 and Equation 13.

$$VI+:VI-=(\alpha)^{1/2}:(1-\alpha)^{1/2}$$ [Equation 12]

$$VQ+:VQ-=(\beta)^{1/2}:(1-\beta)^{1/2}$$ [Equation 13]

When $i_{TOTAL}$, which is the total amount of the currents, is constant, a magnitude of a vector that is finally generated and has the in-phase component may be substantially the same as a magnitude difference between the first vector VI+ and the second vector VI−, and a magnitude of a vector that is finally generated and has the quadrature component may be substantially the same as a magnitude difference between the third vector VQ+ and the fourth vector VQ−. Thus, a magnitude R and a phase θ of an output vector OV corresponding to the output signal OS that is finally generated may satisfy following Equation 14 and Equation 15.

$$R = k \cdot \sqrt{2\ 4\sqrt{\alpha(1\ \alpha)}} = k \cdot \sqrt{2\ 4\sqrt{\beta(1\ \beta)}}$$ [Equation 14]

$$\theta = \tan^{-1}((1-\gamma)/\gamma)^{1/2}$$ [Equation 15]

It may be seen from Equation 14 that the magnitude of the output signal OS is only related to α or β and not to γ. It may be seen from Equation 15 that the phase of the output signal OS is only related to γ and not to α or β.

In other words, since α (or β) and γ are independent variables, only the phase of the output signal OS may be controlled by adjusting γ related to a ratio of ($i_{ITOTAL}$: $i_{QTOTAL}$) while fixing the magnitude of the output signal OS if α or β related to a ratio of $i_{IP}$:$i_{IM}$) or a ratio of ($I_{QP}$:$i_{QM}$) is fixed. In addition, only the magnitude of the output signal OS may be controlled by adjusting α or β related to the ratio of ($i_{IP}$:$i_{IM}$) or the ratio of ($I_{QP}$:$i_{QM}$) while fixing the phase of the output signal OS if γ related to the ratio of ($i_{ITOTAL}$: $i_{QTOTAL}$) is fixed. Since the I and Q signals are attenuated at the same ratio, only the magnitude of the output signal OS may be attenuated while the phase of the output signal OS is maintained.

However, the total current $i_{TOTAL}$ flowing through the vector summation circuit 3030 may be always maintained constant regardless of the phase or the gain of the output signal OS, as described above. Therefore, the output impedance may be fixed, the impedance matching with the next stage may not be changed, the phase change due to the gain change or the gain change due to the phase change may not occur, and thus the gain and the phase may be adjusted independently of each other.

In some example embodiments, as illustrated in FIG. 11B, a phase range of the output vector OV corresponding to the output signal OS may be determined by α and β. For example, when α=β, α>0.5 and β>0.5, the output vector OV may be located in a first quadrant. When α=(1−β), α<0.5 and β>0.5, the output vector OV may be located in a second quadrant. When α=β, α<0.5 and β<0.5, the output vector OV may be located in the third quadrant. When α=β, α>0.5 and β<0.5, the output vector OV may be located in the fourth quadrant.

FIGS. 12, 13, 14, 15 and 16 are diagrams illustrating examples of a digital-to-analog converter included in a variable gain phase shifter according to example embodiments.

Figure 12:
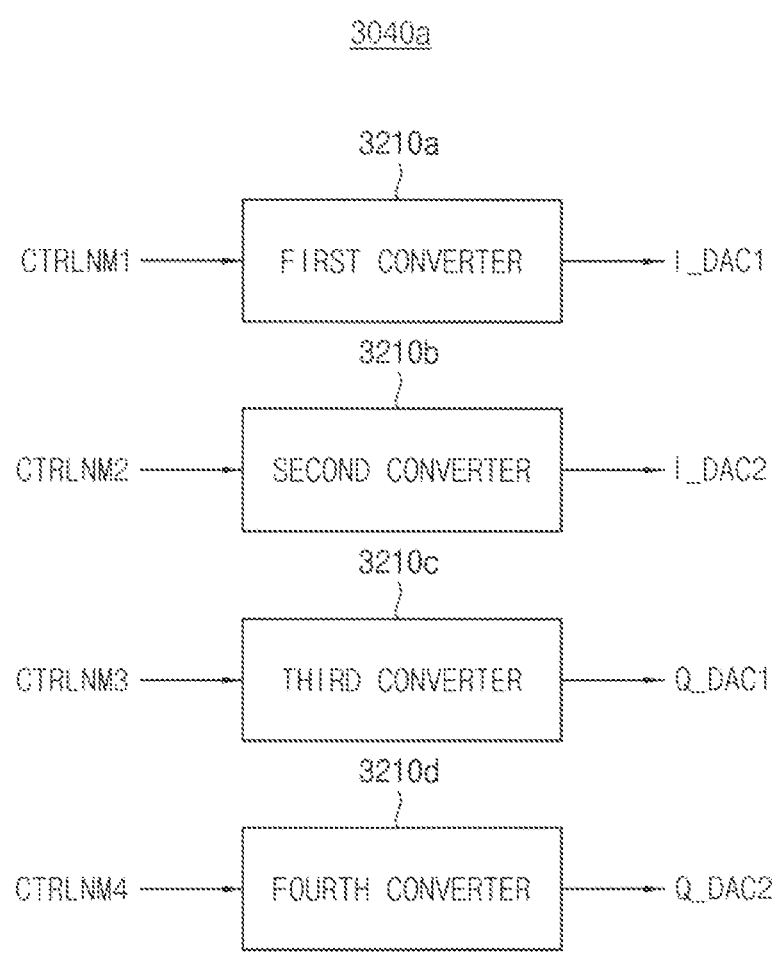
FIGS. 12, 13, 14, 15 and 16 are diagrams illustrating examples of a digital-to-analog converter included in a variable gain phase shifter according to example embodiments.

Referring to FIG. 12, a digital-to-analog converter 3040a may include a first converter 3210a, a second converter 3210b, a third converter 3210c and a fourth converter 3210d.

The first converter 3210a may generate the first current control signal I_DAC1 based on first digital control bits CTRLNM1. The second converter 3210b may generate the second current control signal I_DAC2 based on second digital control bits CTRLNM2. The third converter 3210c may generate the third current control signal Q_DAC1 based on third digital control bits CTRLNM3. The fourth converter 3210d may generate the fourth current control signal Q_DAC2 based on fourth digital control bits CTRLNM4. Although not illustrated in detail, the first, second, third, and fourth converters 3210a, 3210b, 3210c, and 3210d may have the same configuration, and may operate individually and/or independently of each other.

In some example embodiments, each of the first, second, third and fourth digital control bits CTRLNM1, CTRLNM2, CTRLNM3 and CTRLNM4 may have N*M bits, where each of N and M is a natural number greater than or equal to two. The digital-to-analog converter 3040a of FIG. 12 may perform the gain adjustment of M bits and the phase adjustment of N bits based on the first, second, third and fourth digital control bits CTRLNM1, CTRLNM2, CTRLNM3 and CTRLNM4.

Figure 13:
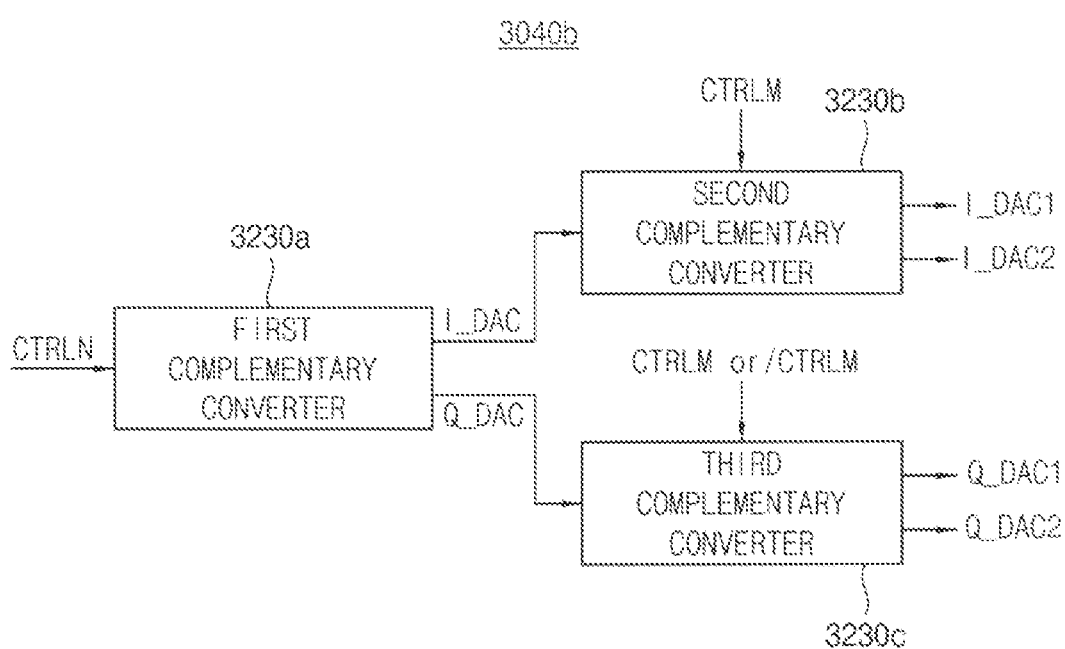
Figure 14:
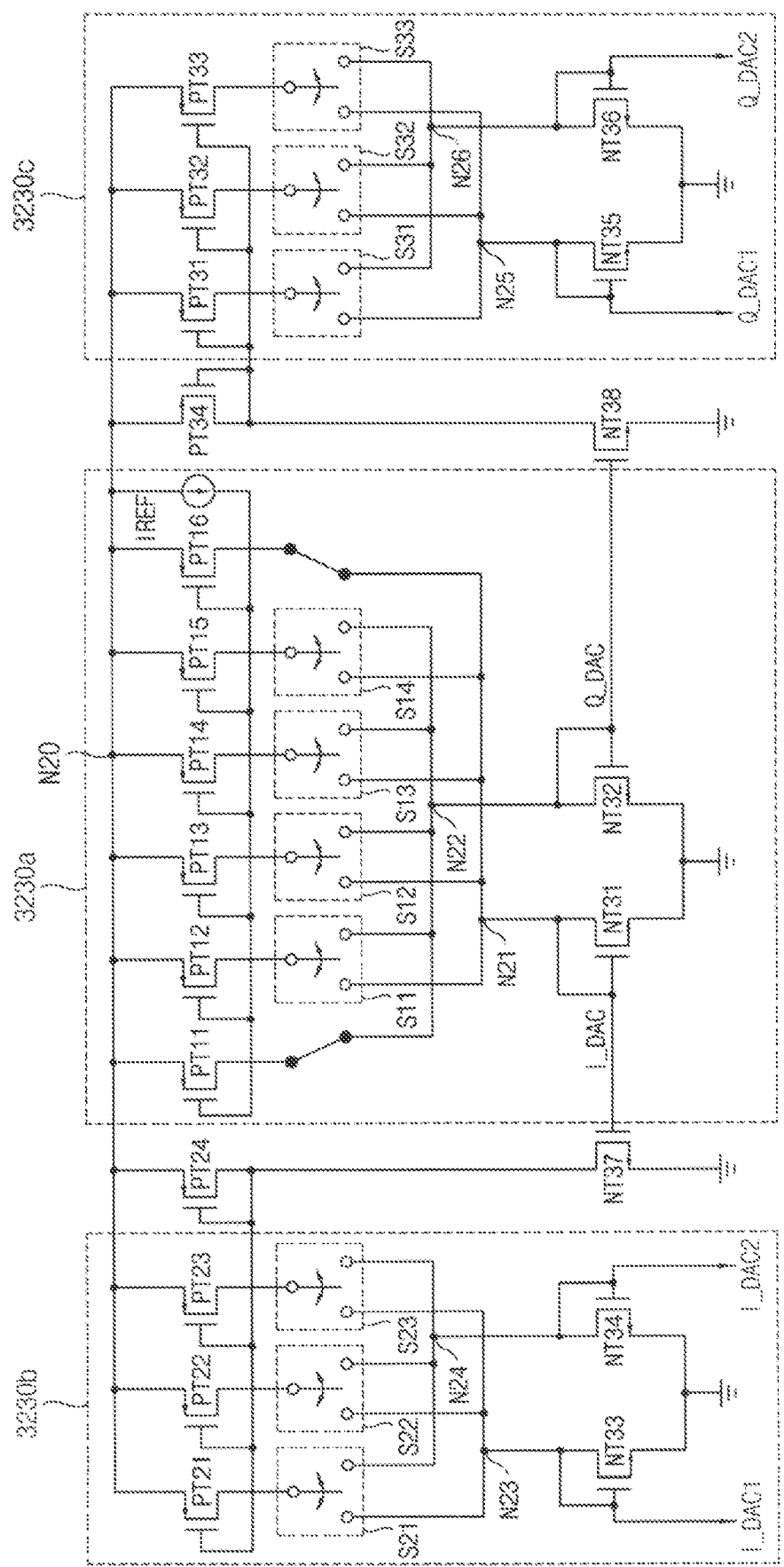

Referring to FIGS. 13 and 14, a digital-to-analog converter 3040b may include a first complementary converter 3230a, a second complementary converter 3230b and a third complementary converter 3230c.

The first complementary converter 3230a may generate first and second intermediate control signals I_DAC and Q_DAC based on first digital control bits CTRLN. The second complementary converter 3230b may generate the first and second current control signals I_DAC1 and I_DAC2 based on second digital control bits CTRLM and the first intermediate control signal I_DAC. The third complementary converter 3230c may generate the third and fourth current control signals Q_DAC1 and Q_DAC2 based on the second digital control bits CTRLM (or inverted bits/CTRLM of the second digital control bits CTRLM) and the second intermediate control signal Q_DAC. As illustrated in FIG. 14, the first, second and third complementary converters 3230a, 3230b and 3230c may have a similar configuration to each other, and may operate in conjunction with each other.

In some example embodiments, the first digital control bits CTRLN may have N bits, and the second digital control bits CTRLM may have M bits. The digital-to-analog converter 3040b of FIG. 13 may perform the gain adjustment of M bits and the phase adjustment of N bits based on the first and second digital control bits CTRLN and CTRLM, and thus the size and power consumption may be reduced while having a simpler structure than the digital-to-analog converter 3040a of FIG. 12.

The first complementary converter 3230a may include a plurality of first transistors PT51, PT52, PT53, PT54, PT55 and PT56, a plurality of first switches S51, S52, S53 and S54, a first current mirror transistor NT71 and a second current mirror transistor NT72. The first complementary converter 3230a may further include a reference current source IREF.

The plurality of first transistors PT51 to PT56 may have gate electrodes commonly connected to each other, and may have first electrodes connected to a node N60. A power supply voltage may be applied to the node N60. The reference current source IREF may be connected between the node N60 and the gate electrodes of the plurality of first transistors PT51 to PT56.

The plurality of first switches S51 to S54 may electrically connect the plurality of first transistors PT51 to PT56 with one of a first node N61 and a second node N62 based on the first digital control bits CTRLN. For example, the first switch S51 may electrically connect the first transistor PT52 with one of the first node N61 and the second node N62 based on one of the first digital control bits CTRLN.

Although not illustrated in detail, each of the plurality of first switches S51 to S54 may receive a respective one bit of the first digital control bits CTRLN, and may be turned on and/or off in response to the respective one bit of the first digital control bits CTRLN.

Although FIG. 14 illustrates an example where the transistor PT51 is always connected to the second node N62, the transistor PT56 is always connected to the first node N61, and the number of the plurality of first switches S51 to S54 is smaller than the number of the plurality of first transistors PT51 to PT56, example embodiments are not limited thereto. For example, as with the second complementary converter 3230b, the number of the plurality of first switches may be equal to the number of the plurality of first transistors.

The first current mirror transistor NT71 may be connected between the first node N61 and a ground voltage, and may have a gate electrode connected to the first node N61 to provide the first intermediate control signal I_DAC. The second current mirror transistor NT72 may be connected between the second node N62 and the ground voltage, and may have a gate electrode connected to the second node N62 to provide the second intermediate control signal Q_DAC.

The first complementary converter 3230a may generate the first and second intermediate control signals I_DAC and Q_DAC by adjusting the amount of currents flowing through the first and second current mirror transistors NT71 and NT72 based on controls of the first switches S51 to S54 by the first digital control bits CTRLN. The sum of the current flowing through the first current mirror transistor NT71 and the current flowing through the second current mirror transistor NT72 (e.g., the total amount of the currents flowing through the first and second current mirror transistors NT71 and NT72) may be maintained constant, and thus the sum of the first and second intermediate control signals I_DAC and Q_DAC may be maintained constant.

The second complementary converter 3230b may include a plurality of second transistors PT61, PT62 and PT63, a plurality of second switches S61, S62 and S63, a third current mirror transistor NT73 and a fourth current mirror transistor NT74.

The plurality of second transistors PT61 to PT63 may have gate electrodes commonly connected to each other, and may have first electrodes connected to the node N60.

The plurality of second switches S61 to S63 may electrically connect the plurality of second transistors PT61 to PT63 with one of a third node N63 and a fourth node N64 based on the second digital control bits CTRLM.

Although FIG. 14 illustrates an example where the number of the plurality of second switches S61 to S61 is equal to the number of the plurality of second transistors PT61 to PT63, example embodiments are not limited thereto. For example, as with the first complementary converter 3230a, the number of the plurality of second switches may be smaller than the number of the plurality of second transistors.

The third current mirror transistor NT73 may be connected between the third node N63 and the ground voltage, and may have a gate electrode connected to the third node N63 to provide the first current control signal I_DAC1. The fourth current mirror transistor NT74 may be connected between the fourth node N64 and the ground voltage, and may have a gate electrode connected to the fourth node N64 to provide the second current control signal I_DAC2.

The third complementary converter 3230c may have a configuration substantially the same as that of the second complementary converter 3230b. The third complementary converter 3230c may include a plurality of third transistors PT71, PT72 and PT73, a plurality of third switches S71, S72 and S73, a fifth current mirror transistor NT75 and a sixth current mirror transistor NT76.

The plurality of third transistors PT71 to PT73 may have gate electrodes commonly connected to each other, and may have first electrodes connected to the node N60.

The plurality of third switches S71 to S73 may electrically connect the plurality of third transistors PT71 to PT73 with one of a fifth node N65 and a sixth node N66 based on the second digital control bits CTRLM or the inverted bits /CTRLM of the second digital control bits CTRLM.

The fifth current mirror transistor NT75 may be connected between the fifth node N65 and the ground voltage, and may have a gate electrode connected to the fifth node N65 to provide the third current control signal Q_DAC1. The sixth current mirror transistor NT76 may be connected between the sixth node N66 and the ground voltage, and may have a gate electrode connected to the sixth node N66 to provide the fourth current control signal Q_DAC2.

The second and third complementary converters 3230b and 3230c may generate the current control signals I_DAC1, I_DAC2, Q_DAC1 and Q_DAC2 by adjusting the amount of currents flowing through the current mirror transistors NT73 to NT76 based on controls of the switches S61 to S63 and S71 to S73 by the second digital control bits CTRLM. The sum of the currents flowing through the current mirror transistors NT73 and NT74 may be maintained constant, and thus the sum of the current control signals I_DAC1 and I_DAC2 may be maintained constant. The sum of the currents flowing through the current mirror transistors NT75 and NT76 may be maintained constant, and thus the sum of the current control signals Q_DAC1 and Q_DAC2 may be maintained constant.

The digital-to-analog converter 3040b may further include a first connection circuit that connects the first complementary converter 3230a with the second complementary converter 3230b, and a second connection circuit that connects the first complementary converter 3230a with the third complementary converter 3230c. The first connection circuit may include transistors PT64 and NT77 connected in series between the node N60 and the ground voltage. A gate electrode of the transistor PT64 may be connected to the gate electrodes of the second transistors PT61 to PT63 and a second electrode of the transistor PT64, and a gate electrode of the transistor NT77 may be connected to the gate electrode of the first current mirror transistor NT71 to receive the first intermediate control signal I_DAC. The second connection circuit may include transistors PT74 and NT78 connected in series between the node N60 and the ground voltage. A gate electrode of the transistor PT74 may be connected to the gate electrodes of the third transistors PT71 to PT73 and a second electrode of the transistor PT74, and a gate electrode of the transistor NT78 may be connected to the gate electrode of the second current mirror transistor NT72 to receive the second intermediate control signal Q_DAC.

Although FIG. 14 illustrate an example where the transistors PT51 to PT56, PT61 to PT64 and PT71 to PT74 are p-type metal oxide semiconductor (PMOS) transistors and the transistors NT71 to NT78 are NMOS transistors, the types of transistors included in the digital-to-analog converter 3040b may be changed according to example embodiments.

In some example embodiments, the types and numbers of the transistors PT51 to PT56, PT61 to PT64, PT71 to PT74 and NT71 to NT78 and the switches S51 to S54, S61 to S63 and S71 to S73 included in the digital-to-analog converter 3040b may be changed.

Figure 15:
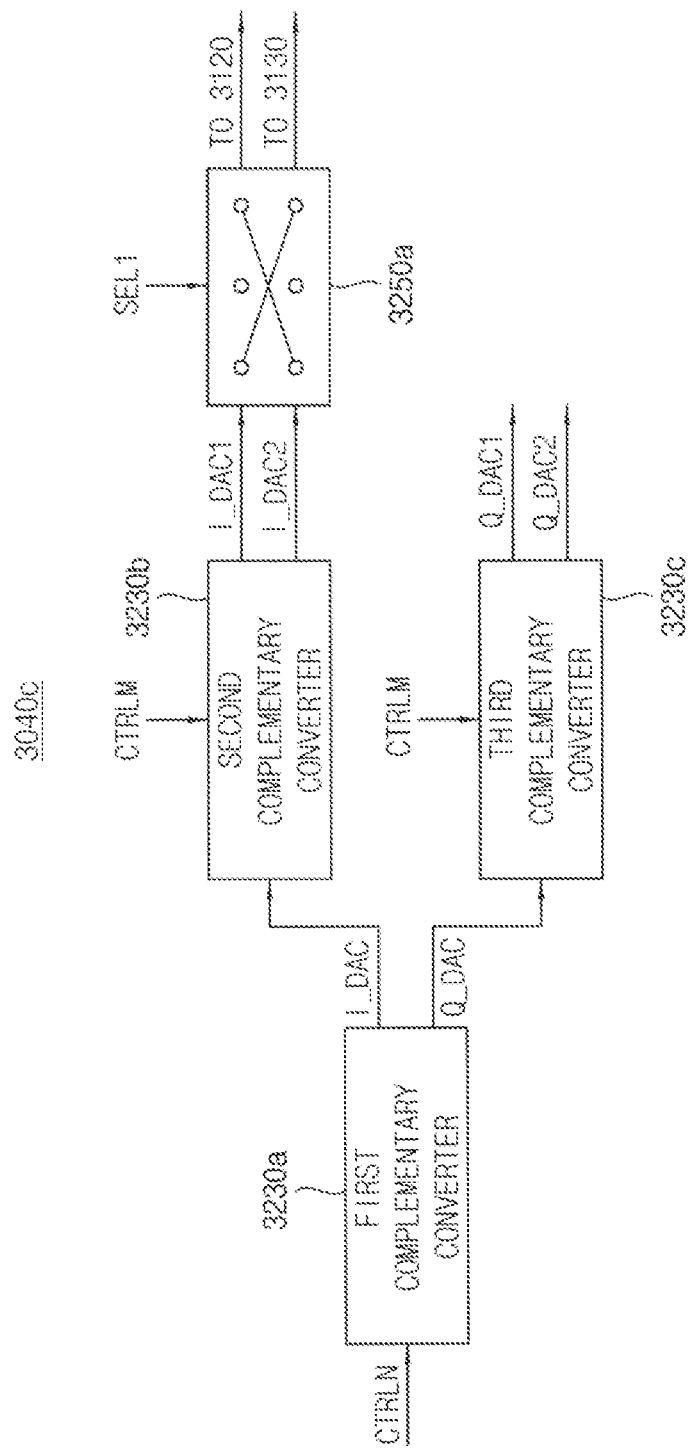

Referring to FIG. 15, a digital-to-analog converter 3040c may include a first complementary converter 3230a, a second complementary converter 3230b and a third complementary converter 3230c. The digital-to-analog converter 3040c may further include a first double pole double throw (DPDT) switch 3250a.

The digital-to-analog converter 3040c of FIG. 15 may be substantially the same as the digital-to-analog converter 3040b of FIGS. 13 and 14, except that the digital-to-analog converter 3040c further includes the first DPDT switch 3250a. The first and second complementary converters 3230a and 3230b in FIG. 15 may be substantially the same as the first and second complementary converters 3230a and 3230b in FIGS. 13 and 14, respectively. The third complementary converter 3230c in FIG. 15 may be substantially the same as the third complementary converter 3230c in FIGS. 13 and 14, except that the third complementary converter 3230c in FIG. 15 operates based only on the second digital control bits CTRLM.

The first DPDT switch 3250a may be connected to an output terminal of the second complementary converter 3230b. The first DPDT switch 3250a may provide the one of the first and second current control signals I_DAC1 and I_DAC2 to the first current control circuit 3120, and may provide the other one of the first and second current control signals I_DAC1 and I_DAC2 to the second current control circuit 3130, based on the first selection signal SEL1.

The digital-to-analog converter 3040c of FIG. 15 may exchange the magnitude of the first current $i_{IP}$ which is the forward direction component of the I signal and the magnitude of the second current $i_{IM}$ which is the reverse direction component of the I signal each other using the first DPDT switch 3250a, without generating the inverted bits /CTRLM of the second digital control bits CTRLM.

Figure 16:
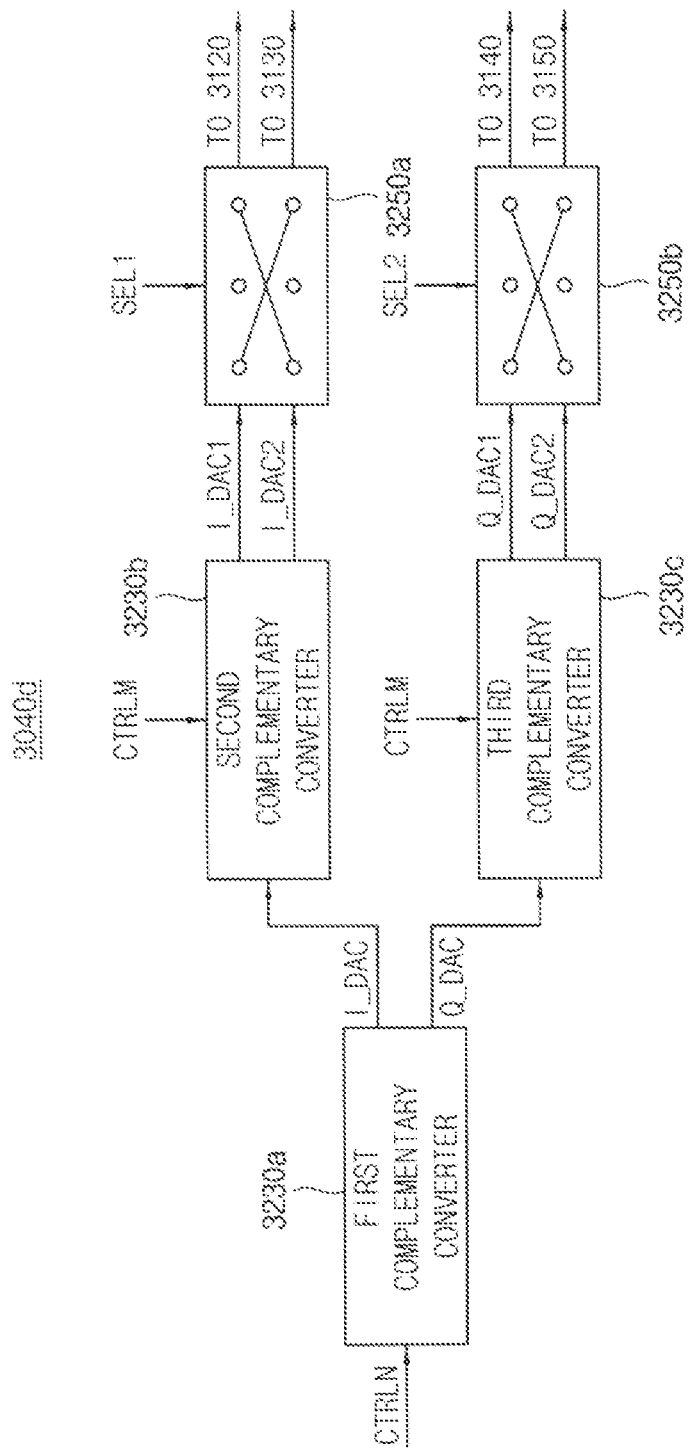

Referring to FIG. 16, a digital-to-analog converter 3040d may include a first complementary converter 3230a, a second complementary converter 3230b and a third complementary converter 3230c. The digital-to-analog converter 3040c may further include a first DPDT switch 3250a and a second DPDT switch 3250b.

The digital-to-analog converter 3040d of FIG. 16 may be substantially the same as the digital-to-analog converter 3040c of FIG. 15, except that the digital-to-analog converter 3040d further includes the second DPDT switch 3250b.

The second DPDT switch 3250b may be connected to an output terminal of the third complementary converter 3230c. The second DPDT switch 3250b may provide the one of the third and fourth current control signals Q_DAC1 and Q_DAC2 to the third current control circuit, and may provide the other one of the third and fourth current control signals Q_DAC1 and Q_DAC2 to the fourth current control circuit, based on the second selection signal SEL2.

The digital-to-analog converter 3040d of FIG. 16 may exchange the magnitude of the first current $i_{IP}$ which is the forward direction component of the I signal and the magnitude of the second current $i_{IM}$ which is the reverse direction component of the I signal each other using the first DPDT switch 3250a, or may exchange the magnitude of the third current $i_{QP}$ which is the forward direction component of the Q signal and the magnitude of the fourth current $i_{QM}$ which is the reverse direction component of the Q signal each other using the second DPDT switch 3250b, without generating the inverted bits /CTRLM of the second digital control bits CTRLM.

In other words, the forward direction component and the reverse direction component of the I signal may be swapped for or interchanged with each other, the forward direction component and the reverse direction component of the Q signal may be swapped for or interchanged with each other, or both the forward direction component and the reverse direction component of the I signal and the forward direction component and the reverse direction component of the Q signal may be swapped for or interchanged with each other, using the complementary converters and/or the at least one DPDT switch. Thus, the phase shift or about 180 degree and the phase shift of about 90 degree may be efficiently performed, and the first to fourth quadrants illustrated in FIG. 11B may be efficiently represented. In addition, since the DPDT switch is not disposed in a DC path of the vector summation circuit 3030, the variable gain phase shifter according to example embodiments may be efficiently applied to a system using a relatively low operating voltage.

Although not illustrated in FIGS. 15 and 16, the digital-to-analog converter according to example embodiments may include only the first complementary converter 3230a, the second complementary converter 3230b, the third complementary converter 3230c and the second DPDT switch 3250b.

Although FIGS. 13, 14, 15 and 16 illustrate examples where the first and second current control signals I_DAC1 and I_DAC2 are generated by one complementary converter 3230b and the third and fourth current control signals Q_DAC1 and Q_DAC2 are generated by another complementary converter 3230c, example embodiments are not limited thereto. For example, the first and third current control signals I_DAC1 and Q_DAC1 may be generated by one complementary converter, and the second and fourth current control signals I_DAC2 and Q_DAC2 may be generated by another complementary converter. The complementary converter included in the digital-to-analog converter according to example embodiments may be referred to as a differential converter.

Figure 17:
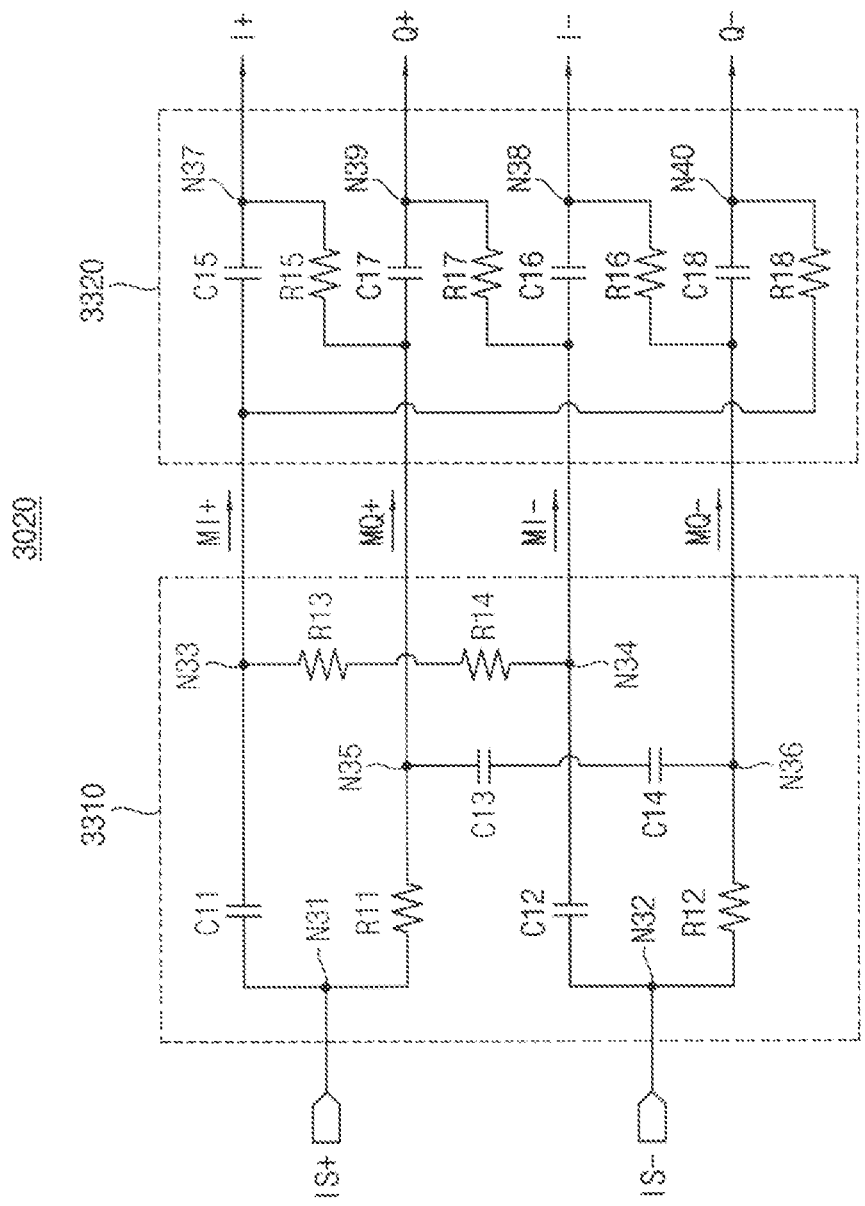
FIG. 17 is a circuit diagram illustrating an I/Q generator included in a variable gain phase shifter according to example embodiments.

FIG. 17 is a circuit diagram illustrating an I/Q generator included in a variable gain phase shifter according to example embodiments.

Referring to FIG. 17, the I/Q generator 3020 may include a resistor-capacitor (RC) ladder 3310 and a poly phase filter 3320.

The RC ladder 3310 may generate first, second, third and fourth intermediate phase signals MI+, MI−, MQ+ and MQ− based on first and second differential input signals IS+ and IS−.

The RC ladder 3310 may include a first capacitor C51, a second capacitor C52, a third capacitor C53, a fourth capacitor C54, a first resistor R51, a second resistor R52, a third resistor R53 and a fourth resistor R54. The first capacitor C51 may be connected between a first input node N71 receiving the first differential input signal IS+ and a first intermediate node N73 outputting the first intermediate phase signal MI+. The second capacitor C52 may be connected between a second input node N72 receiving the second differential input signal IS− and a second intermediate node N74 outputting the second intermediate phase signal MI−. The first resistor R51 may be connected between the first input node N71 and a third intermediate node N75 outputting the third intermediate phase signal MQ+. The second resistor R52 may be connected between the second input node N72 and a fourth intermediate node N76 outputting the fourth intermediate phase signal MQ−. The third and fourth resistors R53 and R54 may be connected in series between the first intermediate node N73 and the second intermediate node N74. The third and fourth capacitors C53 and C54 may be connected in series between the third intermediate node N75 and the fourth intermediate node N76.

The poly phase filter 3320 may generate the first, second, third and fourth phase signals I+, I−, Q+ and Q− based on the first, second, third and fourth intermediate phase signals MI+, MI−, MQ+ and MQ−.

The poly phase filter 3320 may include a fifth capacitor C55, a sixth capacitor C56, a seventh capacitor C57, an eighth capacitor C58, a fifth resistor R55, a sixth resistor R56, a seventh resistor R57 and an eighth resistor R58. The fifth capacitor C55 may be connected between the first intermediate node N73 and a first output node N77 outputting the first phase signal I+. The sixth capacitor C56 may be connected between the second intermediate node N74 and a second output node N78 outputting the second phase signal I−. The seventh capacitor C57 may be connected between the third intermediate node N75 and a third output node N79 outputting the third phase signal Q+. The eighth capacitor C58 may be connected between the fourth intermediate node N76 and a fourth output node N80 outputting the fourth phase signal Q−. The fifth resistor R55 may be connected between the first output node N77 and the third intermediate node N75. The sixth resistor R56 may be connected between the second output node N78 and the fourth intermediate node N76. The seventh resistor R57 may be connected between the third output node N79 and the second intermediate node N74. The eighth resistor R58 may be connected between the fourth output node N80 and the first intermediate node N73.

Figure 18A:
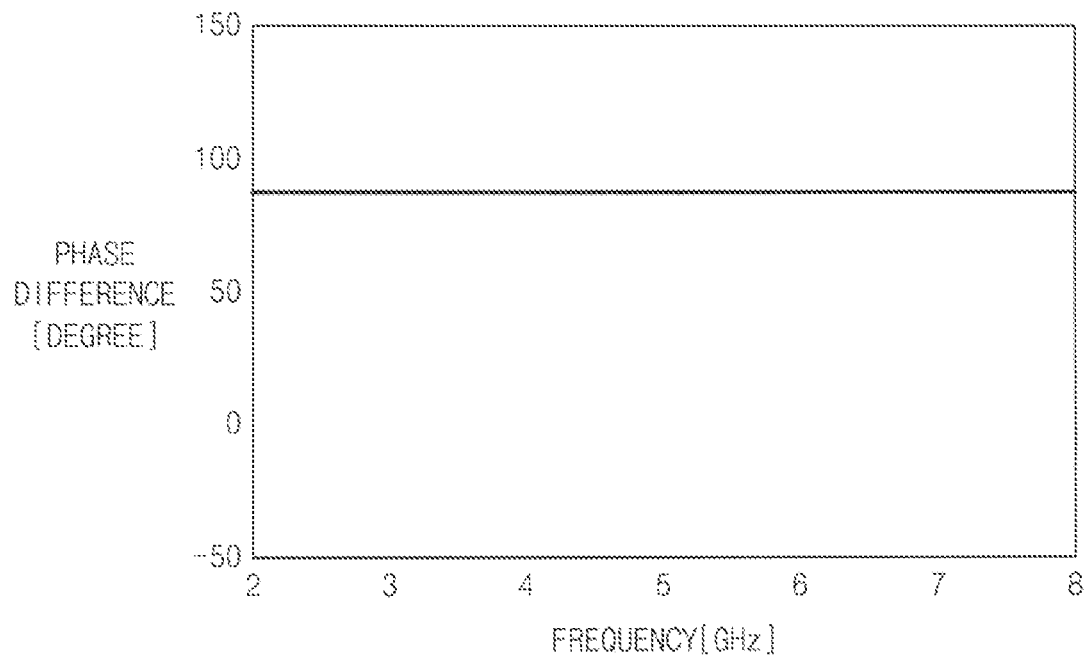
FIGS. 18A and 18B are diagrams illustrating characteristic of an I/Q generator included in a variable gain phase shifter according to example embodiments.
Figure 18B:
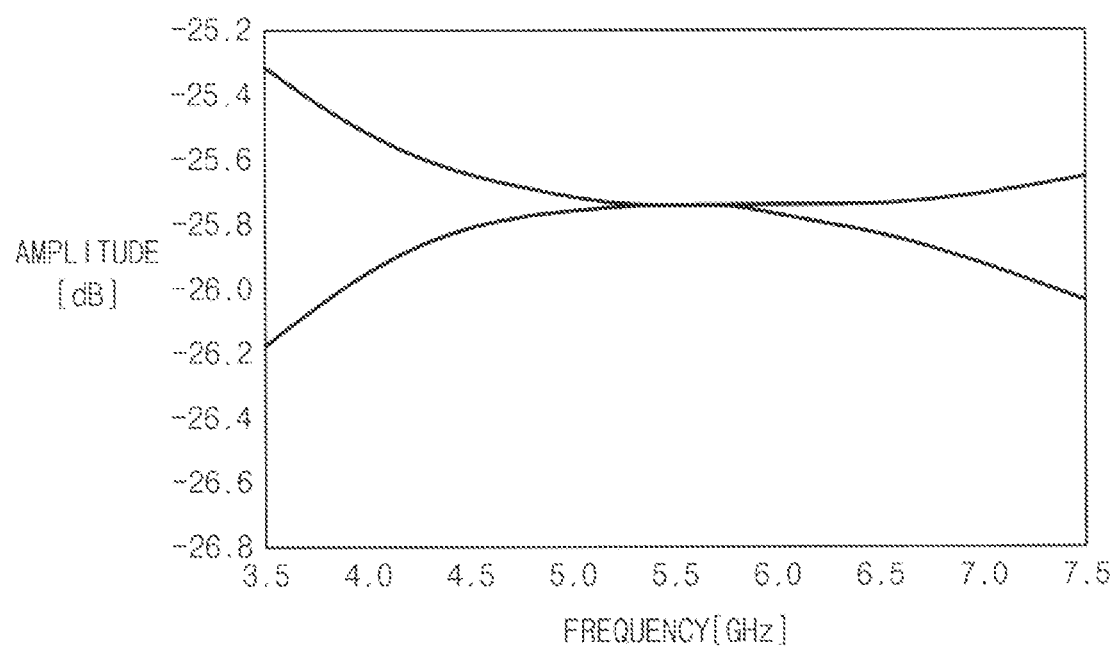

FIGS. 18A and 18B are diagrams illustrating characteristic of an I/Q generator included in a variable gain phase shifter according to example embodiments.

Referring to FIGS. 17, 18A and 18B, in the I/Q generator 3020, a phase difference between the I signal and the Q signal may always be maintained to about 90 degrees in all frequency bands, thereby reducing a phase error. In addition, in the I/Q generator 3020, amplitudes of the I signal and the Q signal may nearly be constant in a frequency band of about 5 to 6 GHz (e.g., about 0.03 dB error), thereby reducing an amplitude error.

If the I/Q generator includes only the RC ladder, there is no phase error, however, the further away from a center frequency the amplitude error increases. If the I/Q generator includes only the poly phase filter, there is no amplitude error, however, the further away from a center frequency the phase error increases.

In the I/Q generator 3020 according to example embodiments, the RC ladder 3310 and the poly phase filter 3320 may be connected in series, and thus both the phase error and the amplitude error may be significantly reduced.

The above described embodiments may be applied to various communication devices and systems including the variable gain phase shifter and various electronic devices and systems including the various communication devices and systems. For example, the example embodiments may be applied to devices or systems such as a mobile phone, a smart phone, a tablet computer, a laptop computer, a personal digital assistant (PDA), a portable multimedia player (PMP), a digital camera, a portable game console, a navigation device, a wearable device, an internet of things (IoT) device, an internet of everything (IoE) device, an e-book reader, a virtual reality (VR) device, an augmented reality (AR) device, a robotic device, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A variable gain phase shifter comprising:
    an in-phase/quadrature (I/Q) generator configured to generate first, second, third and fourth phase signals based on an input signal;
    a vector summation circuit configured to adjust magnitudes and directions of first and second in-phase vectors and first and second quadrature vectors, and to generate first and second differential output signals corresponding to an output signal by summing the first and second in-phase vectors and the first and second quadrature vectors, based on the first, second, third and fourth phase signals, first and second selection signals and first, second, third and fourth current control signals; and
    a digital-to-analog converter configured to generate the first, second, third and fourth current control signals,
    wherein the vector summation circuit includes:
    a first vector summation cell configured to adjust the directions of the first in-phase vector and the first quadrature vector based on the first selection signal;
    a second vector summation cell configured to adjust the directions of the second in-phase vector and the second quadrature vector based on the second selection signal;

first and second current control circuits connected to the first vector summation cell, and configured to adjust an amount of a first current corresponding to the first in-phase vector and an amount of a second current corresponding to the first quadrature vector based on the first and second current control signals; and third and fourth current control circuits connected to the second vector summation cell, and configured to adjust an amount of a third current corresponding to the second in-phase vector and an amount of a fourth current corresponding to the second quadrature vector based on the third and fourth current control signals, and wherein the digital-to-analog converter includes:

a first complementary converter configured to generate first and second intermediate control signals based on first digital control bits;

a second complementary converter configured to generate the first and second current control signals based on second digital control bits and the first intermediate control signal; and a third complementary converter configured to generate the third and fourth current control signals based on the second digital control bits and the second intermediate control signal.

2. The variable gain phase shifter of claim 1, wherein the first complementary converter includes:

a plurality of first transistors of which gate electrodes are commonly connected to each other;

a plurality of first switches configured to electrically connect the plurality of first transistors with one of a first node and a second node based on the first digital control bits;

a first current mirror transistor connected between the first node and a ground voltage and having a gate electrode connected to the first node to provide the first intermediate control signal; and a second current mirror transistor connected between the second node and the ground voltage and having a gate electrode connected to the second node to provide the second intermediate control signal.

3. The variable gain phase shifter of claim 2, wherein the second complementary converter includes:

a plurality of second transistors of which gate electrodes are commonly connected to each other;

a plurality of second switches configured to electrically connect the plurality of second transistors with one of a third node and a fourth node based on the second digital control bits;

a third current mirror transistor connected between the third node and the ground voltage and having a gate electrode connected to the third node to provide the first current control signal; and a fourth current mirror transistor connected between the fourth node and the ground voltage and having a gate electrode connected to the fourth node to provide the second current control signal.

4. The variable gain phase shifter of claim 3, wherein the third complementary converter includes:

a plurality of third transistors of which gate electrodes are commonly connected to each other;

a plurality of third switches configured to electrically connect the plurality of third transistors with one of a fifth node and a sixth node based on the second digital control bits;

a fifth current mirror transistor connected between the fifth node and the ground voltage and having a gate electrode connected to the fifth node to provide the third current control signal; and a sixth current mirror transistor connected between the sixth node and the ground voltage and having a gate electrode connected to the sixth node to provide the fourth current control signal.

5. A variable gain phase shifter comprising:

an in-phase/quadrature (I/Q) generator configured to generate first, second, third and fourth phase signals based on an input signal; and a vector summation circuit configured to adjust magnitudes of first, second, third and fourth vectors, and to generate first and second differential output signals corresponding to an output signal by summing the first, second, third and fourth vectors, based on the first, second, third and fourth phase signals and first, second, third and fourth current control signals, the first and second vectors having in-phase components and opposite directions, the third and fourth vectors having quadrature components and opposite directions, and wherein the vector summation circuit includes:

a first current control circuit configured to adjust an amount of a first current corresponding to the first vector based on one of the first and second current control signals;

a second current control circuit configured to adjust an amount of a second current corresponding to the second vector based on an other one of the first and second current control signals;

a third current control circuit configured to adjust an amount of a third current corresponding to the third vector based on one of the third and fourth current control signals;

a fourth current control circuit configured to adjust an amount of a fourth current corresponding to the fourth vector based on an other one of the third and fourth current control signals; and a vector summation cell connected to all the first, second, third and fourth current control circuits, and configured to receive the first, second, third and fourth phase signals and to generate the first and second differential output signals based on the first, second, third and fourth currents, and wherein the vector summation cell includes:

a first vector circuit connected between first and second output nodes and a first node, and configured to receive the first and second phase signals, the first and second output nodes outputting the first and second differential output signals, respectively;

a second vector circuit connected between the first and second output nodes and a second node, and configured to receive the first and second phase signals;

a third vector circuit connected between the first and second output nodes and a third node, and configured to receive the third and fourth phase signals; and a fourth vector circuit connected between the first and second output nodes and a fourth node, and configured to receive the third and fourth phase signals.

6. The variable gain phase shifter of claim 5, wherein:

the first current control circuit includes a first current control transistor that is connected between the first node and a ground voltage and has a gate electrode receiving the one of the first and second current control signals, the second current control circuit includes a second current control transistor that is connected between the second node and the ground voltage and has a gate electrode receiving the other one of the first and second current control signals, the third current control circuit includes a third current control transistor that is connected between the third node and the ground voltage and has a gate electrode receiving the one of the third and fourth current control signals, and the fourth current control circuit includes a fourth current control transistor that is connected between the fourth node and the ground voltage and has a gate electrode receiving the other one of the third and fourth current control signals.

7. The variable gain phase shifter of claim 5, wherein the first vector circuit includes:
   a first transistor connected between the first output node and the first node and having a gate electrode receiving the first phase signal; and
   a second transistor connected between the second output node and the first node and having a gate electrode receiving the second phase signal.

8. The variable gain phase shifter of claim 5, further comprising:
   a digital-to-analog converter configured to generate the first, second, third and fourth current control signals, and
   wherein the digital-to-analog converter includes:
   a first complementary converter configured to generate first and second intermediate control signals based on first digital control bits;
   a second complementary converter configured to generate the first and second current control signals based on second digital control bits and the first intermediate control signal; and
   a third complementary converter configured to generate the third and fourth current control signals based on the second digital control bits and the second intermediate control signal.

9. The variable gain phase shifter of claim 8, further comprising:
   a first double pole double throw (DPDT) switch connected to an output terminal of the second complementary converter, and configured to provide the one of the first and second current control signals to the first current control circuit and to provide the other one of the first and second current control signals to the second current control circuit.

10. The variable gain phase shifter of claim 9, further comprising:
    a second DPDT switch connected to an output terminal of the third complementary converter, and configured to provide the one of the third and fourth current control signals to the third current control circuit and to provide the other one of the third and fourth current control signals to the fourth current control circuit.

11. The variable gain phase shifter of claim 5, wherein the I/Q generator includes:
    a resistor-capacitor (RC) ladder configured to generate first, second, third and fourth intermediate phase signals based on first and second differential input signals corresponding to the input signal; and
    a poly phase filter configured to generate the first, second, third and fourth phase signals based on the first, second, third and fourth intermediate phase signals.

12. The variable gain phase shifter of claim 11, wherein the RC ladder includes:
    a first capacitor connected between a first input node receiving the first differential input signal and a first intermediate node outputting the first intermediate phase signal;
    a second capacitor connected between a second input node receiving the second differential input signal and a second intermediate node outputting the second intermediate phase signal;
    a first resistor connected between the first input node and a third intermediate node outputting the third intermediate phase signal;
    a second resistor connected between the second input node and a fourth intermediate node outputting the fourth intermediate phase signal;
    third and fourth resistors connected in series between the first intermediate node and the second intermediate node; and
    third and fourth capacitors connected in series between the third intermediate node and the fourth intermediate node.

13. The variable gain phase shifter of claim 12, wherein the poly phase filter includes:
    a fifth capacitor connected between the first intermediate node and a first output node outputting the first phase signal;
    a sixth capacitor connected between the second intermediate node and a second output node outputting the second phase signal;
    a seventh capacitor connected between the third intermediate node and a third output node outputting the third phase signal;
    an eighth capacitor connected between the fourth intermediate node and a fourth output node outputting the fourth phase signal;
    a fifth resistor connected between the first output node and the third intermediate node;
    a sixth resistor connected between the second output node and the fourth intermediate node;
    a seventh resistor connected between the third output node and the second intermediate node; and
    an eighth resistor connected between the fourth output node and the first intermediate node.

* * * * *